United States Patent [19]

Ebata et al.

[11] 4,430,959

[45] Feb. 14, 1984

[54] SEMICONDUCTOR VAPOR PHASE GROWING APPARATUS

[75] Inventors: Hitoshi Ebata, Mishima; Shigetugu Matunaga, Gotenba, both of Japan

[73] Assignee: Toshiba Kikai Kabushiki Kaisha, Tokyo, Japan

[21] Appl. No.: 461,231

[22] Filed: Jan. 26, 1983

[30] Foreign Application Priority Data

Jan. 28, 1982 [JP] Japan .................................. 57-11997

[51] Int. Cl.³ ............................ B05C 1/00; B05C 3/00
[52] U.S. Cl. .................................... 118/697; 118/665; 118/666; 118/688; 118/692; 118/693; 118/695; 118/698; 364/472; 364/500
[58] Field of Search ............... 118/697, 665, 666, 688, 118/692, 693, 695, 698; 364/472, 500

[56] References Cited

U.S. PATENT DOCUMENTS

| | | | |
|---|---|---|---|
| 4,125,643 | 11/1978 | Reuschel et al. | 427/9 |
| 4,332,833 | 6/1982 | Aspnes et al. | 427/8 |
| 4,348,886 | 9/1982 | Faith, Jr. | 427/8 X |
| 4,388,342 | 6/1983 | Suzuki et al. | 427/8 |

*Primary Examiner*—Thurman K. Page
*Attorney, Agent, or Firm*—Cushman, Darby & Cushman

[57] ABSTRACT

In apparatus for vapor phase growing N or P type semiconductor layers on semiconductor substrates supported by a rotary support disposed in a reaction furnace, and various types of gases are admitted into the furnace through a pipe line network and valves, there is provided a control device for ON-OFF controlling the valves according to a predetermined program. The control device comprises a memory region for storing a process program group including a group of process programs including informations regarding a time for designating a process of vapor phase growth in the reaction furnace, gases utilized, flow quantity thereof and furnace temperature, and a system program that decodes the program group for producing control signals for the valves.

11 Claims, 25 Drawing Figures

FIG. 9

PROCESS NAME: PPG (4)

| PP NO. | TIME | GAS FLOW | | | | | | θ °C |
|---|---|---|---|---|---|---|---|---|
| | | $N_2$ | $H_2$ | $D_N$ | $D_P$ | $SiCl_4$ | HCL | TEMPERATURE |
| 1 | 3:00 | FN1L | | | | | | |
| 2 | 3:00 | | FN2L | | | | | |
| 3 | 3:00 | | ↓ | | | | | θ1 |
| 4 | 3:00 | | | | | | | θ2 |
| 5 | 3:00 | | | | | | FNHCL | ↓ |
| 6 | 3:00 | | | | | | ↓ | ↓ |
| 7 | 3:00 | | | | | | | ↓ |
| 8 | 3:00 | | | | | | | θ3 |
| 9 | 3:00 | | | | FDP | FSI | | ↓ |
| 10 | 3:00 | | | | ↓ | ↓ | | ↓ |
| 11 | 3:00 | | ↓ | | | | | ↓ |
| 12 | | | | | | | | ↓ |
| 13 | | | | | | | | ↓ |
| 14 | | | | | | | | ↓ |
| 15 | 3:00 | | ↓ | | | | | |
| 16 | 3:00 | | ↓ | | | | | |
| 17 | 3:00 | FN17L | | | | | | |
| (END) | | | | | | | | |

SEMICONDUCTOR VAPOR PHASE GROWING APPARATUS

BACKGROUND OF THE INVENTION

This invention relates to semiconductor vapor phase growing apparatus. So called vapor phase growing apparatus in which vapor phase growth is performed on a semiconductor wafer has called attention in recent years because semiconductor tips are used in various industrial fields. In the vapor phase growing apparatus now being used, a sequence program (hereinafter termed a process program) indicative of the progress of the process in a reaction furnace is excecuted by a system in which the progress of the sequence is designated by a pin board switch or the like, and the flow quantity of the gas used and the furnace temperature are designated by setting variable resistors contained in a control device by an operator.

FIG. 1 is a block diagram explaining the conventional manner of controlling the progress of the process in a reaction furnace with a pin board switch system.

In FIG. 1, pins are inserted into a set panel of a pin board switch according to an order of execution of a process program PPi (i=1-17), and the set panel is constructed such that the sequence times of the process program of the respectively designated orders can be set in the units of hours, minutes and seconds.

To a relay ladder circuit B are applied instructions corresponding to the order of a sequence, that is instructions that make effective the contents of process programs pp2, pp3, pp4, pp6, pp5 and pp6 corresponding to steps ①, ②, ... ⑥, ⑦ so as to give control signals to valves or like means corresponding to respective instructed processes. With such pin board system, however, only the times of respective process sequences can be set, but the flow quantity of the gas used and the furnace temperature must be set with other measures, for example variable resistors.

In addition to the pin board system shown in FIG. 1, a control device utilizing a general purpose sequence controller has also been proposed. In such control device too, the flow quantity and the furnace temperature are not designated by directly programmed data so that such setters as variable resistors are necessary.

Furthermore, in the pin board system described above, only one group of a series of programs corresponding to one cycle of the reaction furnace, that is only one set of pp2→pp3→pp1→pp4→pp6→pp5→pp7 shown in FIG. 1 can be loaded so that in order to operate a plurality of reaction furnaces a plurality of pin board panel units corresponding thereto should be provided. In this regard, since the general purpose controller contains a timer, only a problem of time designation program is involved. Where the general purpose program is used, since its process program is not contructed to designate the gas flow quantity and the furnace temperature, setters of these parameters have been used. Principal reasons are as follows.

1. Although the system program of a general purpose sequence controller is prepared by its maker, just like the pin board system, the decoding items of the content of the process program according to its system program lack the items regarding gas flow quantity used and the reaction furnace designation temperature. For this reason, the gas flow quantity and the furnace temperature are set by such independent setters as variable resistors or the like manipulated by the operator.

2. From the standpoint of the operator, manipulation of the general purpose sequence controller, the ability of directly controlling the gas flow quantity and the furnace temperature are equivalent to those of the pin board system so that the operator can operate the reaction furnace without any caution. Especially, correction of set values can be made readily.

3. From the standpoint of the maker, where manual setters for the gas quantity and the furnace temperature are omitted, it is necessary to modify the system program so as to include a program for correcting the content of the process program as a portion of the system program.

SUMMARY OF THE INVENTION

It is a principal object of this invention to provide vapor phase growing apparatus provided with an improved program control device prestoring the contents of all process instructions so as to simplify the setting operation of the operator where a plurality of reaction furnaces are operated alternately.

Another object of this invention is to provide vapor phase growing apparatus in which a modifying program that corrects the contents of the process program is included in the system program.

Still another object of this invention is to provide vapor phase growing apparatus wherein where a group of process programs corresponding to an one cycle operation of a reaction furnace is prestored in an external memory medium, there is provided an input device combined with the external memory medium to receive therefrom a group of the process program.

A further object of this invention is to provide vapor phase growing apparatus wherein where induction heating coils in a plurality of reaction furnaces are connected to a common high frequency source via a transfer switch, the timings of supplying electric powers to respective reaction furnaces are adjusted to efficiently supply high frequency powers to respective reaction furnaces from the high frequency source.

Still further object of this invention is to provide vapor phase growing apparatus provided with a system program comprising a program for forming a process program adapted to form a group of process programs corresponding to one cycle of a reaction furnace based on an operating table of the cycle.

According to this invention, there is provided semiconductor vapor phase growing apparatus comprising a reaction furnace for vapor phase growing a semiconductor on a semiconductor substrate; means for heating the substrate; sources of various gases necessary for vapor phase growth; a pipe line network for interconnecting the reaction furnace and the sources; valve means connected in the pipe line network for supplying predetermined quantities of the gases to the reaction furnace; and control means for supplying control signals to the valve means; the control means including a first memory region for storing a process program group comprising a group of process programs including informations regarding a time for designating a process of vapor phase growth in the reaction furnace, gases utilized, flow quantities thereof and furnace temperature, and a second memory region storing a system program that decodes the program groups for producing control signals for the valve means.

BRIEF DESCRIPTION OF THE DRAWINGS

Further objects and advantages of the invention will be more fully understood from the following detailed description taken in conjunction with the accompanying drawings, in which:

FIG. 9 is a table showing the flow quantities in pipe lines;

DESCRIPTION OF THE PREFERRED EMBODIMENTS

Figure 1:
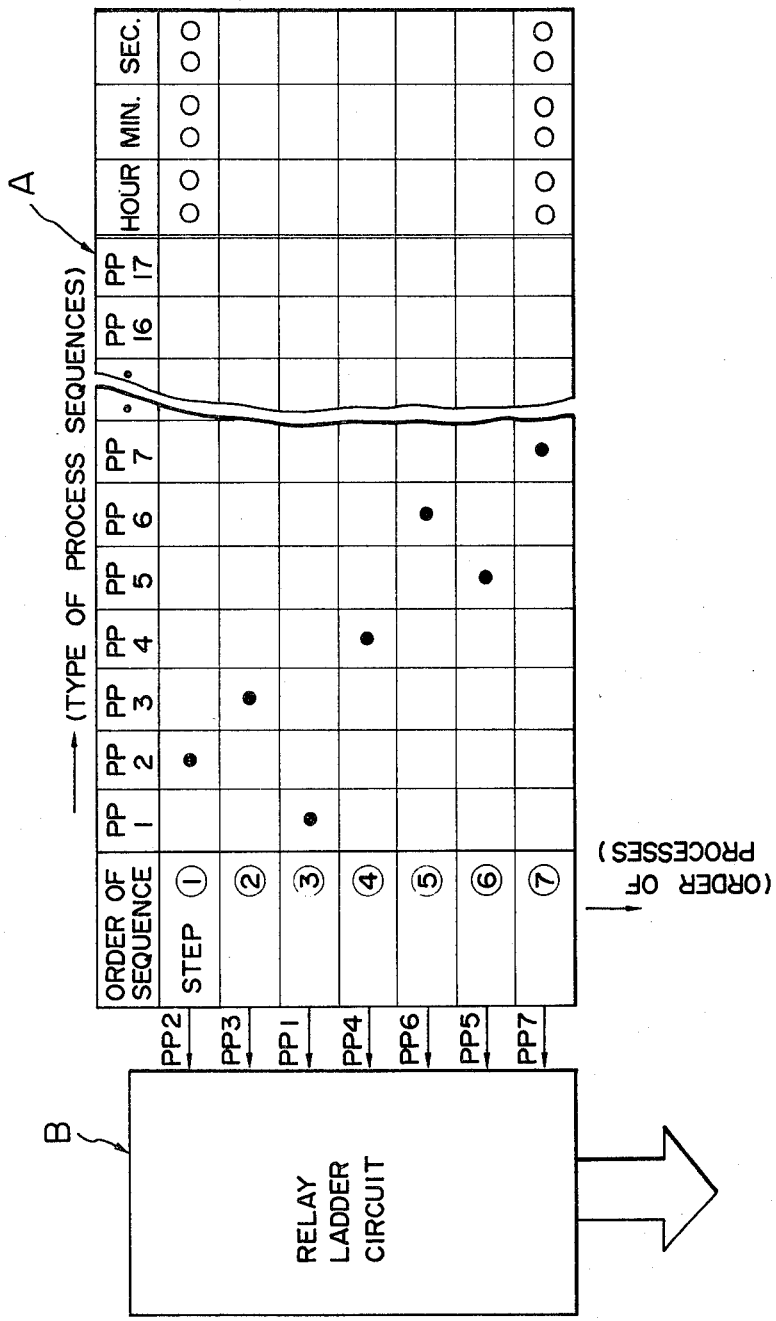
FIG. 1 is a block diagram useful to explain the operation of prior art vapor phase growth control apparatus.
Figure 2:
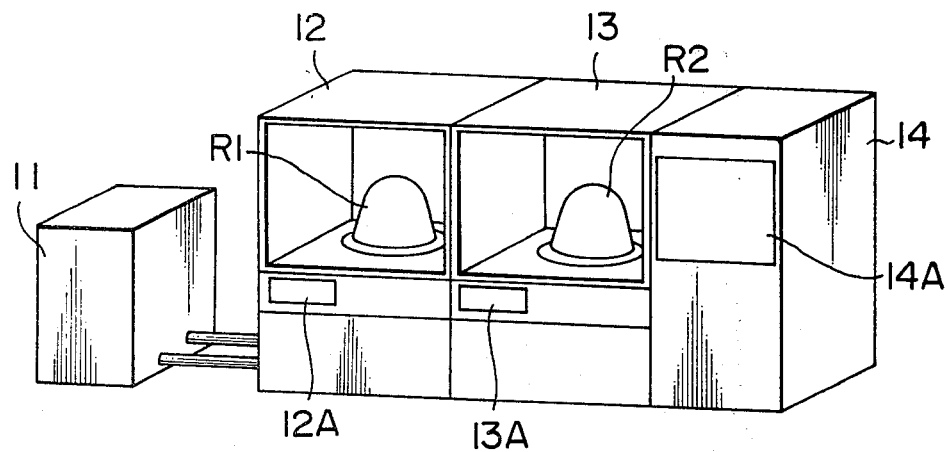
FIG. 2 is a perspective view showing the outline of one embodiment of this invention.
Figure 5:
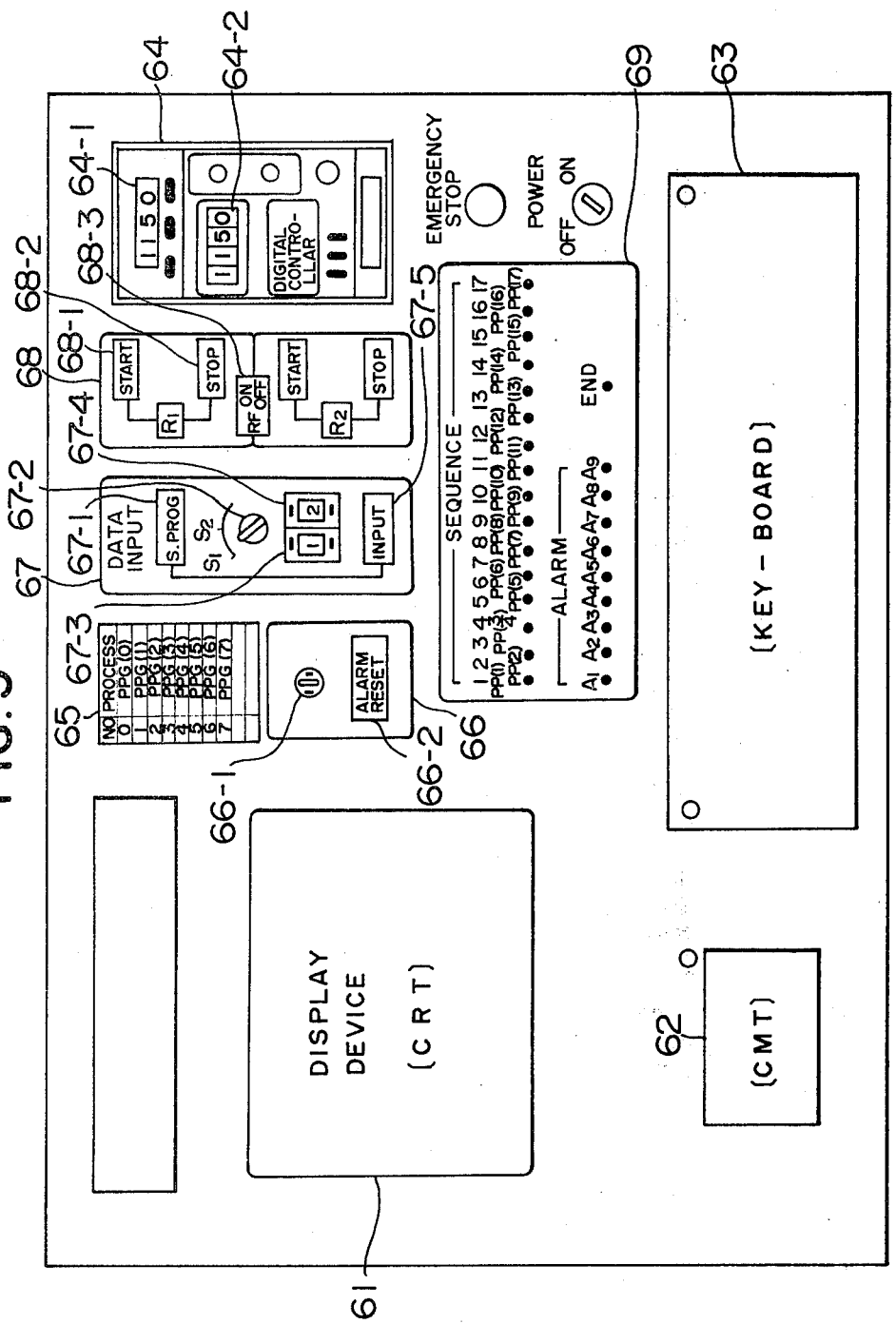
FIG. 5 is a front view showing the detail of the panel of the control apparatus shown in FIG. 2.

The semiconductor vapor phase glowing apparatus of this invention shown in FIG. 2 comprises a high frequency generator 11, reaction furnaces R1 and R2, and a control device 14 which controls the gas flow quantities to respective reaction furnaces and the temperatures thereof. The control device 14 is provided with a control panel 14A including an operating key input unit 14A-1, a display unit 14A-2, etc., and the detail of the control device 14 is shown in FIG. 5. There are also provided operating boards for controlling the operation of the reaction furnaces R1 and R2.

Figure 3:
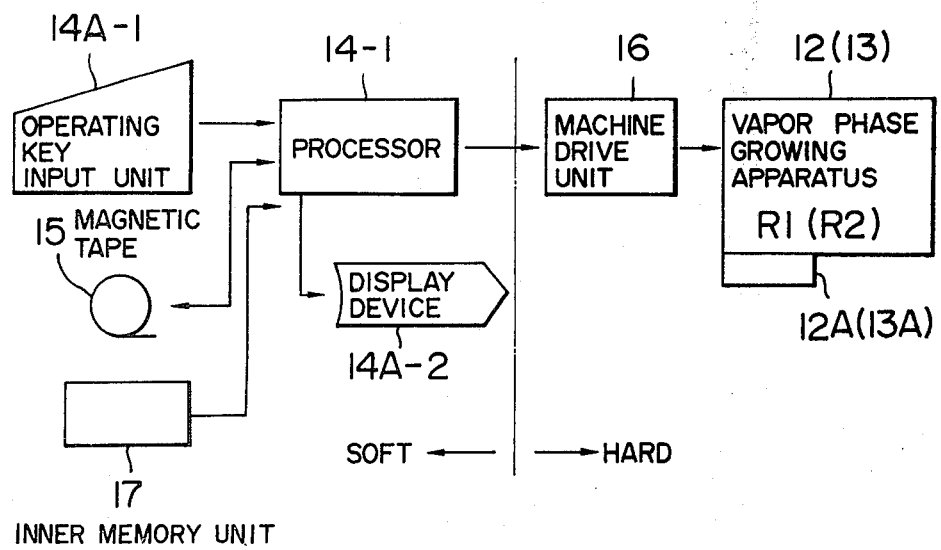
FIG. 3 is a block diagram for explaining the flow of informations in a control system shown in FIG. 2.

Basic elements necessary for operating the vapor phase growing apparatus shown in FIG. 2 are diagrammatically shown in FIG. 3 in which a process program given by operating a key circuit 14A-1, a process program prestored in a cassette magnetic tape 15, or an inner memory unit 17 in the control device 14 is applied to a processor 14-1. The apparatus is constructed so that in response to the inputted process program, the operation of valves provided for a machine device unit 16 and the degree of opening of the valves will be controlled.

The content of the processings executed by the processor 14-1 and the input informations to the processor 14-1 are displayed by a display device 14A-2. Reference character 12(13) represents the main body of the apparatus corresponding to FIG. 2, and quantities of gases set by the machine drive unit 16 are supplied to reaction furnaces R1 and R2. The machine drive unit 16, necessary pipings, valves etc. are provided on the rear side and bottom side of the vapor phase growing apparatus 12 and 13.

Figure 4:
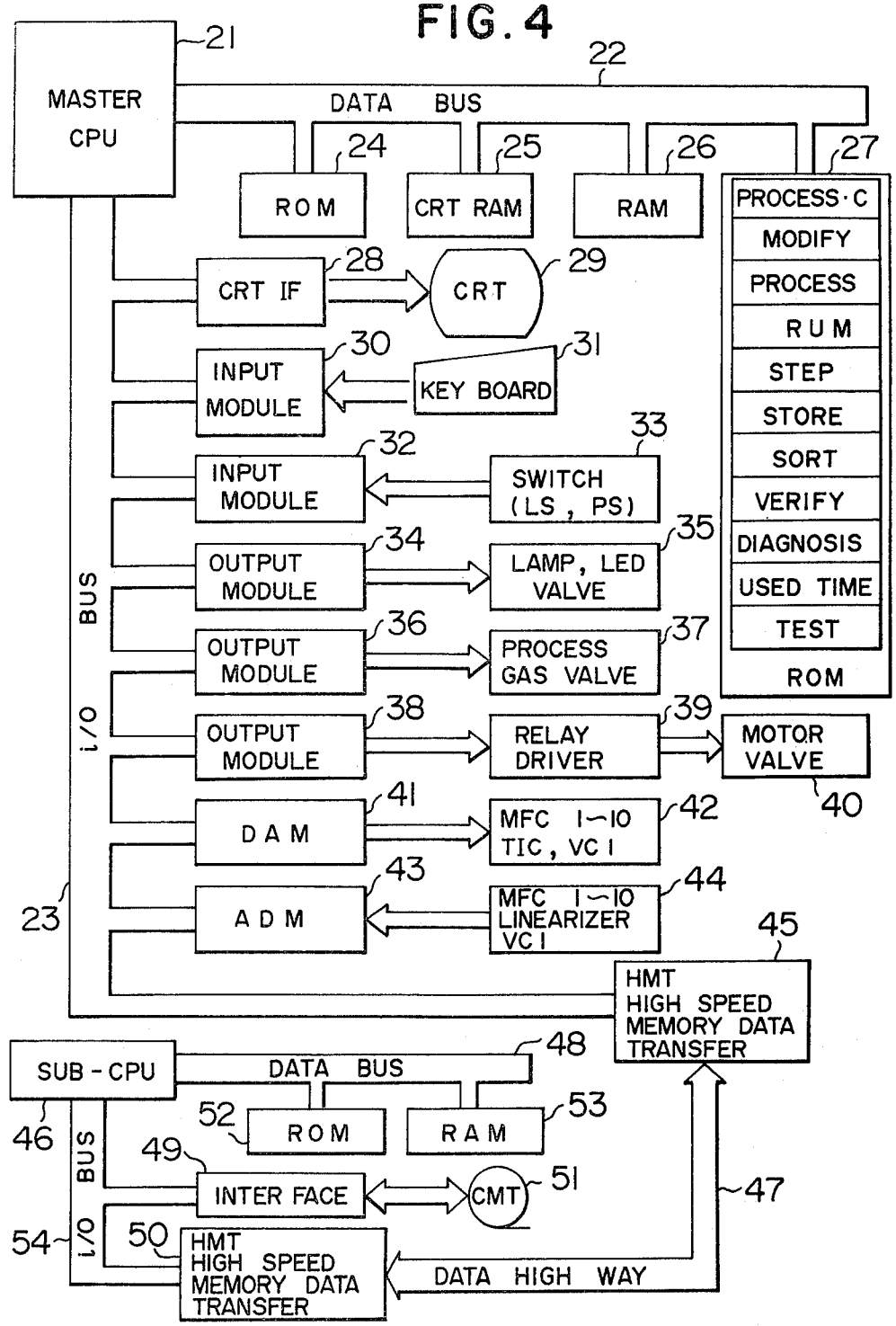
FIG. 4 is a block diagram showing a control system for vapor phase growth according to this invention.

In a block diagram of the control system showing a preferred embodiment of this invention and shown in FIG. 4, 21 designates a central processing unit CPU of a master computer and data bus line 22 and an i/o bus line 23 are connected to the CPU21. To the data bus line 22 are connected a memory device (ROM) 24 prestoring a group of process programs to be executed in the reaction furnaces R1 or R2, a CRT RAM 25 for temporarily storing the contents to be displayed on a display device CRT29, a temporary memory device (RAM)26 and a memory device 27 for storing various system programs necessary to operate the system of this invention.

The temporary memory device 26 is utilized to store data utilized during the operation of the system, for example, input data from a keyboard 31, ON and OFF informations of various switches, and a group of process programs given from such external memory medium as a cassette tape or the like. A CRT interface 28 is connected to the i/o bus line 23 to give a content to be displayed on CRT29. Further, input modules 30 and 32 are provided for temporarily storing input data signals from the keyboard 31, and signals from a pressure switch RS and a limit switch LS respectively.

Output modules 34, 36 and 38 are connected to the i/o bus line 23 so as to give output instructions to an output unit 35 of lamps, LED's, and to valves, process gas valves 37 and a relay driver 39. 40 represents electric motors and valves driven by the relay driver 39, the motors and valves being used to rotate a support or "suscepta" of respective reaction furnaces R1 and R2 and to drive cylinders for opening and closing the lids of the furnaces.

Furthermore, a D/A conversion module (DAM) 41, and an A/D conversion module (ADM) 43 are connected to the i/o bus line 23, the DAM41 giving a control voltage (in an analogue quantity) designating the gas flow quantities flowing through flow quantity control valves MEC, TiC and VCI. The ADM43 is connected to receive an analogue signal as a feedback signal, from a detector that detects flow quantities flowing through respective control valves for converting the received analogue signal into a digital signal.

A sub-CPU46 operates to transfer and store a group of process programs stored in a cassette, magnetic tape (CMT)51 to a temporary memory device (RAM)53 via an interface 49 and to write a group of process programs stored in the RAM53 into CMT51 according to the system program stored in the memory device ROM52. RAM53 and sub-CPU46 are interconnected by a data bus line 48, while an i/o bus line 54 is provided to interconnect the interface 49, a high speed memory data transfer unit (HMT)50 and sub-CPU46.

Another high speed memory data transfer unit (HMT)45 is connected to the i/o bus line 23, the two high speed memory data transfer units 45 and 50 being interconnected by a data highway 47 so that the content of RAM53 can be transferred to RAM26 and vice versa. With this connection, the problems that the computation speed of CPU21 is limited, the time required for reading out process program data from CMT51 or magnetic card or the like and for writing the read out data into CMT51 is long, can be solved.

Of course, instead of using circuit elements 46–55, the data can be exchanged between an input/output module connected to the i/o bus line 23.

Among the system programs stored in ROM27 may be mentioned:

i. A system or process program which controls CPU21 to sequentially read out a group of process programs (PPG) stored in the RAM26 and then decode the read out process programs into corresponding sequence instructions, ii. A modifying program (MODIFY) which controls CPU21 so as to modify the PPG stored in RAM26, iii. A process program forming a program (PROCESS) for forming a new PPG by inputting necessary data by using the keyboard 31, iv. A RUN system program displaying on CRT29 a process now being executed, v. A system program STEP that converts any process program PPi, the group of process programs PPG, into another process program PP(j), vi. A system program (STORE) for storing PPG stored in RAM26 into an external memory medium, for example CMT51, via RAM53, vii. A system program (SORT) performing reverse performance to STORE, viii. Verifying program (VERIFY) for verifying PPG stored in RAM26 before executing the PPG with the system program PROCESS.C, ix. A system program that performs a self-diagnosis during the operation of the system of this invention, x. A system program (USED TIME) for calculating the processing time used for the execution of one group of the process programs, and xi. A system program for executing various tests.

By designating one of them by CPU21, the CPU21 executes a necessary calculation according to the designated system program.

The detail of the operations of various system programs stored in ROM27 shown in FIG. 4 will be described later in detail with reference to flow charts.

The panel operating board shown in FIG. 5 of the control device shown in FIG. 2 comprises a display device 61, in the form of a cathode ray tube CRT for example, a cassette tape mounting device (CMT)62 which mounts a cassette magnetic tape, a keyboard or key input device 63, and a temperature controller 64 including a furnace temperature setting switch 64-1 and a temperature setting switch 64-2, and a display device 65 showing the type of the process program group PPG. An alarm buzzer 66-1 and an alarm reset button 66-2 are installed in an area 66, while a program start push button 67-1, a gas selection transfer switch 67-2, a thumb wheel switch 67-3 for a reaction furnace selection pattern, and a PPG selection designation thumb wheel switch 67-4 are provided in a data input area 67. The transfer switch 67-3 is constructed to have three positions, i.e. 0 at which only furnace R1 is used, 1 at which only furnace R2 is used and 2 at which both furnaces R1 and R2 are used. 67-5 designates a push button which is effective when depressed simultaneously with a push button 67-1.

A start switch 68-1, and a stop switch 68-2 are provided in an area 68, the former being used to issue an instruction for starting a sequence process of one PPG. There are also provided a switch 68-3 for controlling the induction heating furnace and a switch 69 for sequentially lighting LED's corresponding to the types of the processes in which the reaction is progressing. Each PPG comprises suitable combinations of 1–17 sequence processes and LED's $A_1$–$A_9$ for displaying alarms are provided at the lower portion of the area 68.

Figure 6:
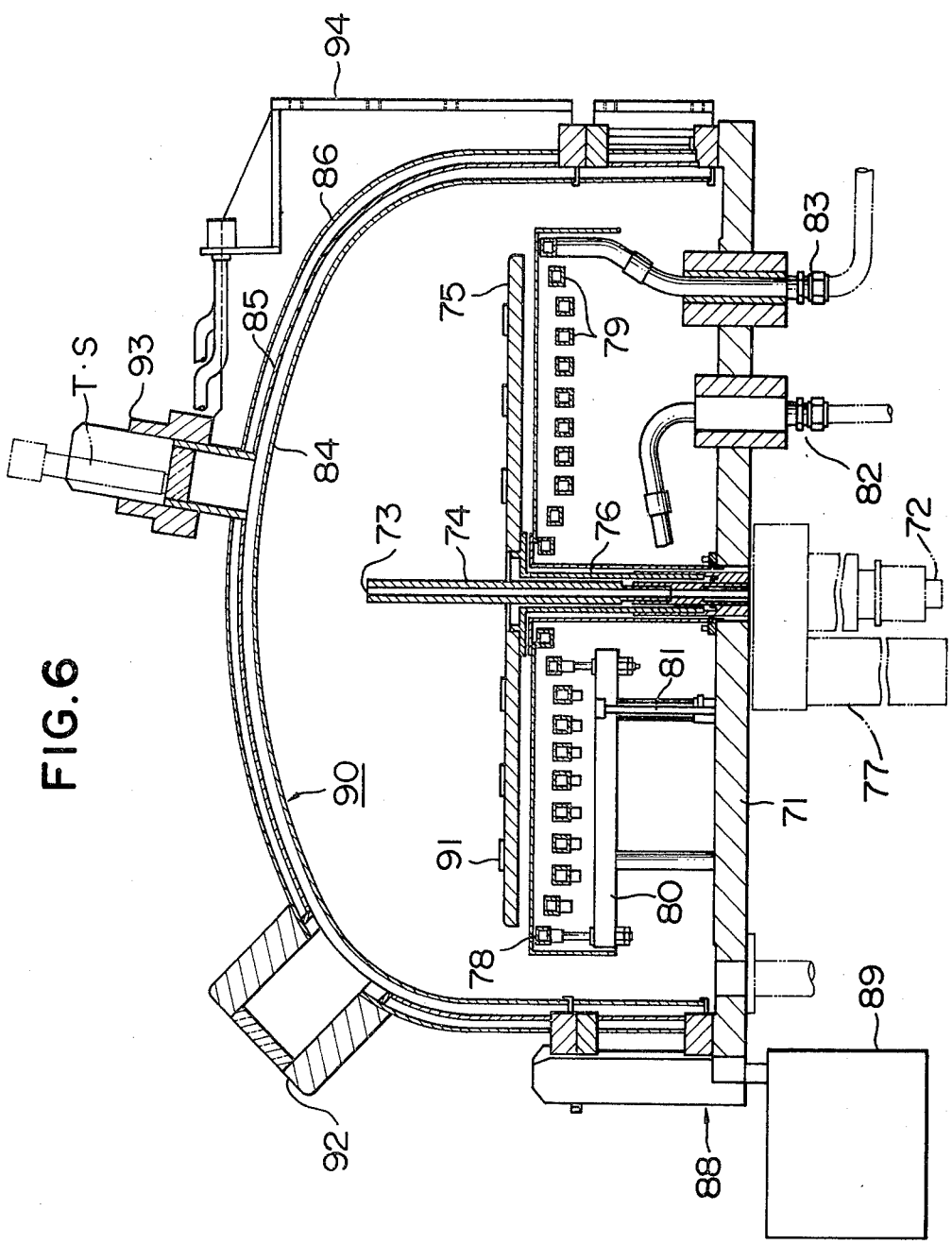
FIG. 6 is a longitudinal sectional view of a reaction furnace containing an induction heating coil.

FIG. 6 shows a vertical sectional view of the reaction furnace R1 or R2. As shown an inlet pipe 72 for supplying gas used for vapor phase growth in the furnace extends vertically through the center of a bottom plate 71. Thus, the gas rises upwardly through a pipe 74 and ejects into the interior of the furnace through an opening 73 at the top of the pipe 74. A rotary member 76 driven by a motor 77 with a reduction gearing is disposed to surround the pipe 74 to support a support 75. An induction heating coil 79 covered by a cover 78 is located beneath the support 75. An insulating plate 80 is secured above the base plate 71 by bolts 81 for supporting the coil 79. The induction heating coil 79 is connected to an external high frequence source, not shown, through terminals 82 and 83. Cooling water is passed through the coil 79 for preventing temperature rise thereof caused by heat generated by high frequency current. A dome or lid 90 covering the heating coil 79 is made up of three layers, e.g. an inner quartz layer 84, a first stainless steel layer 85 and a second stainless steel layer 86. These layers are spaced by air gaps. A clamping member 88 operated by an air piston-cylinder device 89 is provided to clamp the flange 87 of the dome against the bottom plate 71.

The dome 90 is provided with a window 92 for observing support 75 and wafers 91 supported thereby, and a temperature detection window 93 in which is mounted a sensor TS which detects the temperature of the wafers 91 and support 75 by sensing light passing through a quartz layer 84.

A bracket 94 is integrally formed with the dome 90 and arranged to be moved downwardly by the piston of a cylinder, not shown, so as to open the dome 90 when mounting and dismounting the wafers.

Figure 7:
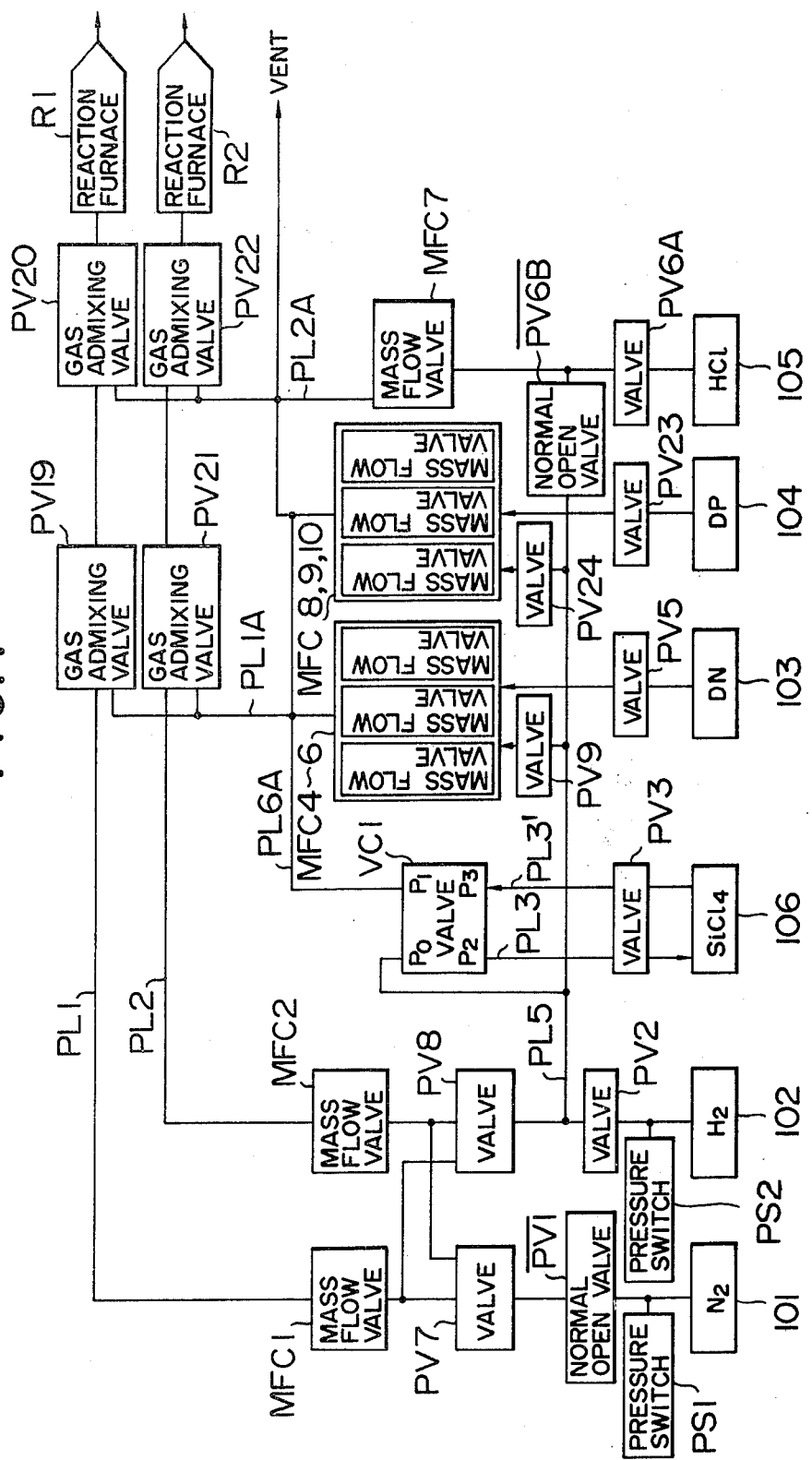
FIG. 7 is a block diagram showing pipe lines interconnecting the reaction furnace shown in FIG. 6 and sources of various gases.

FIG. 7 is a block diagram showing a gas piping network or system connected to reaction furnaces R1 and R2. Gases of $N_2$, $H_2$, DN (a N type dopant), DP (a P type dopant) and HCl are supplied to respective furnaces R1 and R2 through gas chambers 101, 102, 103, 104 and 105 respectively shown on the bottom side of FIG. 7. 106 designates a bubbling chamber containing liquid $SiCl_4$ or $SiHCl_3$.

A pipe line extending upwardly from chamber 101 is provided with a pressure switch PS1, a normal open valve $\overline{PV1}$ (a bar on PV1 shows normal open type) and a valve PV7.

In the same manner, a pipe line extending upwardly from gas chamber 102 is provided with a pressure switch PS2, valves PV2 and PV8. Outputs of the valves PV7 and PV8 are combined and combined gases are supplied to pipe lines PL1 and PL2 respectively through mass flow valves MFC1 and MFC2.

Between pipe line PL1 and the furnace R1 are connected gas admixing valves PV19 and PV20 so as to combine gases supplied through pipes PL1A and PV20 with the gas supplied through pipe line PL1.

In the same manner, gas admixing valves PV21 and PV22 are provided between pipe line PL2 and the reaction furnace R2 to admix gases supplied through pipes PL1A and PL2A with the gas supplied through pipe line PL2.

Two pipe lines are provided between a valve VC1 and gas chamber 106 via a valve PV3. $H_2$ is admitted into port P0 of valve VC1 and then enters into the bubbling chamber 106 via port P2, pipe PL3 and valve PV3 for pubbling liquid $SiCl_4$ contained in the bubbling chamber 106. Consequently, a gaseous mixture of $H_2$ and $SiCl_4$ is formed in the upper space of the bubbling chamber 106 and the mixture is admitted into port P3 of valve VC1 via valve PV3 and a pipe line PL3'. The gas mixture is then sent to pipe line PL6A through port P1 of valve VC1.

$N_2$ gas acting as a dopant is supplied from gas chamber 103 to mass flow valves MFC4, MFC5 and MFC6 through a valve PV5. $H_2$ gas is supplied to the input ports of these mass flow valves through valve PV9 so that a mixture of $H_2$ and $N_2$ is supplied to the gas admixing valve PV19.

Similar circuit is provided for a gas chamber 104 containing P acting as a dopant and includes mass flow valves MFC8, MFC9 and MFC10 and valve $\overline{PV23}$.

A pipe line PL2A extending from the gas chamber 105 containing HCl includes a valve PV6A, and a mass flow valve MFC7 and the upper end of the pipe line PL2A is connected to the inlets of admixing valve PV20 and PV22. The upstream side of the mass flow valve MFC7 is connected to pipe line PL5 via a normal open valve $\overline{PV6B}$.

Figure 8:
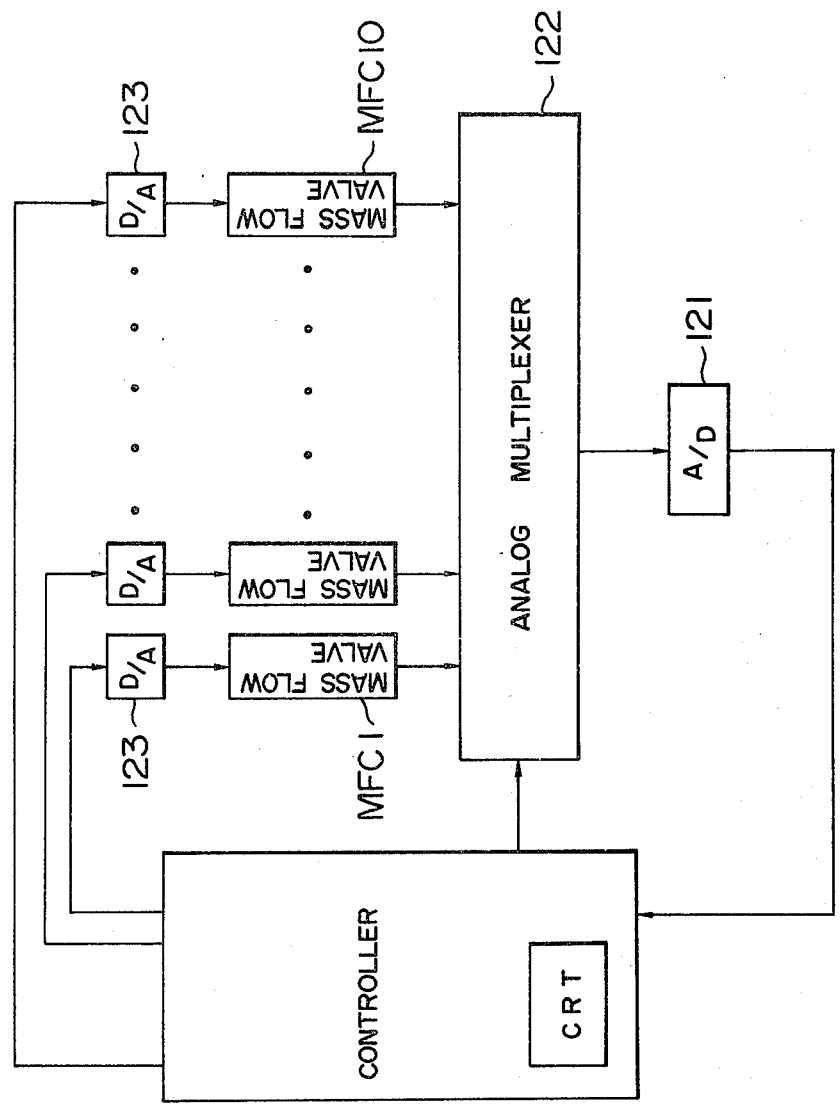
FIG. 8 is a block diagram showing the relation among a mass flow meter connected between a flow quantity controller and a control device for detecting the gas flow quantity and peripheral devices.

As shown in FIG. 8, instructions are applied to mass flow valves MFC1-MFC10 from a control device including the master CPU21 respectively via D/A converters 123. Outputs of flow quantity detectors attached to respective mass flow valves are sequentially applied to an analog multiplexer 122, and the output thereof is supplied to the controller via an analog digital converter 121.

Referring now to FIG. 9, digits 1-17 on the leftmost column correspond to respective process programs and the duration times of the sequences are shown in the next column in minutes and seconds. In a gas flow column, are listed gas flow quantities of the gases utilized in the sequences, while a temperature setting column designating the temperature $\theta°$ C. in the reaction furnace is provided at the rightmost column.

A case wherein the operating table shown in FIG. 9 is applied to the connection diagram shown in FIG. 7 will be described as follows. In FIG. 9, the content of the process program PP(1) is to purge $N_2$ in which $N_2$ is passed at a rate of FN 1 l/min. $N_2$ gas is supplied to the reaction furnace R1 from gas chamber 101 (FIG. 7) via valves $\overline{PV1}$, PV7, MFC1, PV19 and PV20 to purge this furnace. The flow quantity FN 1 l/min. is given as a voltage instruction value to MFC1. The process program PP(2) is used to purge $H_2$, thus setting 3 minutes and a flow quantity of FH 2 l/min. $H_2$ gas enters into the reaction furnace R1 via valves PV2, PV8, MFC1, PV19 and PV20 are then discharged in the same manner as in the $N_2$ purge. In the above, FN1 1 and FH 2 1 designate special codes utilized for executing the program.

The next process program PP(3) (hereinafter PP(i)) is used to HEAT ON(1). At this time, the quantity of $H_2$ supplied to the reaction furnace R1 is FH 2 l/min. and the states of various valves are not altered. The induction heating furnace is set to a first level and heated for three minutes so as to obtain a first set temperature $\theta1$.

At the next process program PP(4) the same flow quantity of $H_2$ is set and the furnace R1 is heated for 3 minutes to attain a second level of set temperature of $\theta2$. The next process step PP(5) is used to VENT HCl. In this case, the heating time is set to 3 minutes and the flow quantities of $H_2$ and HCl are FH 2 l/min. and FHCl 1 l/min. repsectively. HCl flows to a vent opening, not shown, via valves PV6A and MFC7. The flow quantity of HCl is set by an instruction voltage supplied to MFC7.

The next PP(6) is used to ETCH with HCl and continues for 3 min., and HCl is admixed with $N_2$ at gas admixing valve PV20 and the mixture is supplied to reaction furnace R1.

At the next PP(7) $H_2$ is again purged for 3 min. PP(8) is a HEAT DOWN process in which the furnace temperature is changed from $\theta2$ to $\theta3$. Upon completion of PP(8) process lasting 3 min., preparation of the vapor phase growth is substantially completed and the process is advanced to PP(9). PP(9) is used as EPi VENT(1) lasting 3 min., in which $H_2$ is supplied at a rate of FH 2 l/min., dopant gas Dp at a rate of FDp cc/min., and $SiCl_4$ at a rate of $FSiCl_4$ 1 g/min. $H_2$ gas is supplied to chamber 106 via valves PV2, VC1 and PV3, and a gaseous mixture of $H_2$ and $SiCl_4$ is supplied to pipe line PL6A from chamber 106 via valves PVC and VC1. Since dopant gas Dp is supplied from chamber 104 through valves PV23, MFC8, MFC9 and MFC10, the mixture of the dopant gas Dp, and gases $H_2$ and $SiCl_4$ reached the pipe line PL6A is exhausted through a vent opening.

PP(10) is used as EPi DEPO (a code meaning epitaxial deposition) in which the flow quantities of gases are the same as PP(9) but valve PV19 is opened. Consequently, gases Dp, $H_2$ and $SiCl_4$ are admixed by PV19 and then supplied to furnace R1 to form P type semiconductors on the wafers 91 supported by the support 75. The growing reaction at this time is a reversible hydrogen reduction reaction as shown by the following equation.

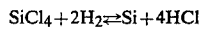

$$SiCl_4 + 2H_2 \rightleftarrows Si + 4HCl$$

In this manner, Si is accumulated on respective wafers. Usually, phosphine ($PH_3$) is used as the dopant gas Dp.

As the dopant gas $D_N$ for growing N type semiconductors, is generally used diborane ($B_2H_4$). When 3 min. elapses at PP(10), the vapor phase growth completes and at PP(11), $H_2$ is passed for 3 min. at a rate of FH 2 l/min. for purging.

PP(12), PP(13) and PP(14) are not used and PP(15) is used as HEAT OFF to deenergize the induction heating coil. 3 minutes are selected for decreasing the furnace temperature. During this interval, $H_2$ is supplied at a rate of FH 2 l/min.

At PP(16), H$_2$ is purged for 3 min. Then, at PP(17), N$_2$ is passed for 3 min. at a rate of FN 17 l/min. for effecting N$_2$ purge.

In FIG. 9, where dopant gas D$_N$ is used for forming layers on N type semiconductors, it can readily be noted from FIG. 7 that D$_N$ is supplied from chamber 103 through valves PV5, PV9, MFC4 and MFC5.

Where reaction furnace R2 is used instead of R1, valves PV19 and PV20 are used instead of PV21 and PV22.

Figure 10:
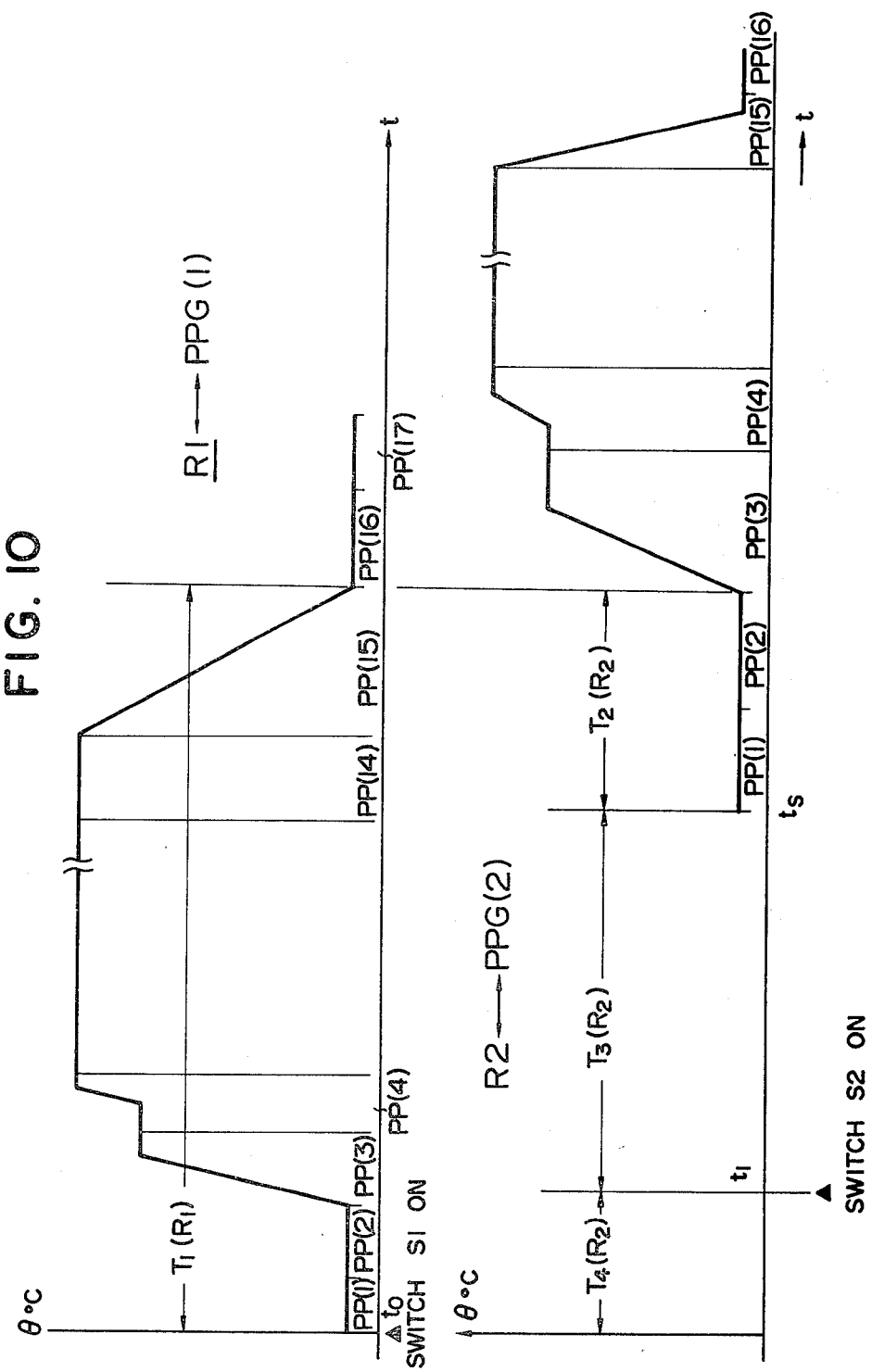
FIG. 10 is a timing chart where two reaction furnaces R1 and R2 are operated alternately.

FIG. 10 is a diagram showing alternate operation of reaction furnaces R1 and R2.

The graph shown on the upper side of FIG. 10 shows the relation between the temperature $\theta°$ C. of the furnace R1 and the progress of respective process programs PP(i), while the graph on the lower side shows the progress of respective process programs PP(i) regarding the furnace R2. When a start switch S1 of the furnace R1 is closed at time t0, the process program group PPG(1) starts and when process programs PP(1) and PP(2) are finished, at PP(3) the induction coil is energized until PP(15).

Immediately upon completion of the PP(15) for furnace R1, supply of the power to the induction coil of furnace R2 is commenced. Thus, the switch S2 for starting the furnace R2 is closed after time T4 has elapsed after closure of switch S1.

Denoting the interval between the closure of switch S2 and start of the first process program PP(1) of the process program group PPG2 by T3(R2) and the interval between PP(1) and PP(3) by T2(R2), to effect alternate running the following relation must be satisfied.

$$T1(R1) - T4(R2) + T3(R2) + T2(R2)$$

Figure 11:
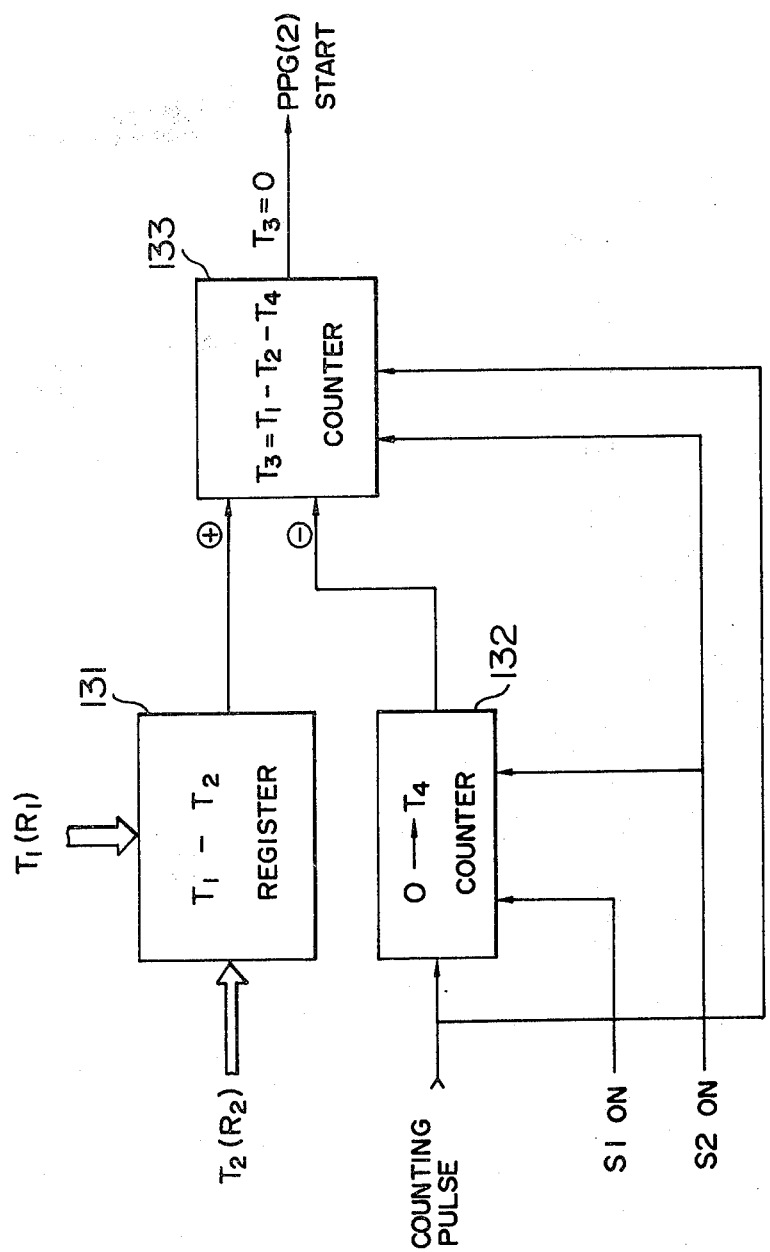
FIG. 11 is a block diagram showing a time calculating unit at the time of alternate operation.

Since the time of closing switch S2 is arbitrary it is difficult to predetermine the actual starting time of PPG(2). (Usually, switch S2 is closed at time t1 when preparation including mounting of the wafers on which semiconductors are to be grown in the furnace is completed.) To realize alternate running shown in FIG. 10 without this problem, a system as shown in FIG. 11 is used. In FIG. 10 time intervals T1(R1) and T2(R2) are known and time data already programmed. In FIG. 11, a register 131 is stored with a difference between intervals T1 and T2. A counter 132 is provided to count the number of counting pulses per second between closures of switches S1 and S2. Another counter 133 is set with the difference T3 between the count (T1−T2) of the register 131 and the count (T4) of the counter 132 at the time of closing the switch S2, and the count of the counter 133 is decremented by the counting pulse. When the counter 133 counts out, PPG(2) is actually started.

Although not shown, according to another method, a counter is provided preset with time T1, and after closure of switch S1, the count is decremented according to a counting pulse. When switch S2 is closed, time T2 is subtracted, and the difference is further decremented according to the timing pulse. When the count of the counter 133 reduces to zero, a start signal is given to PPG(2).

Figure 12B:
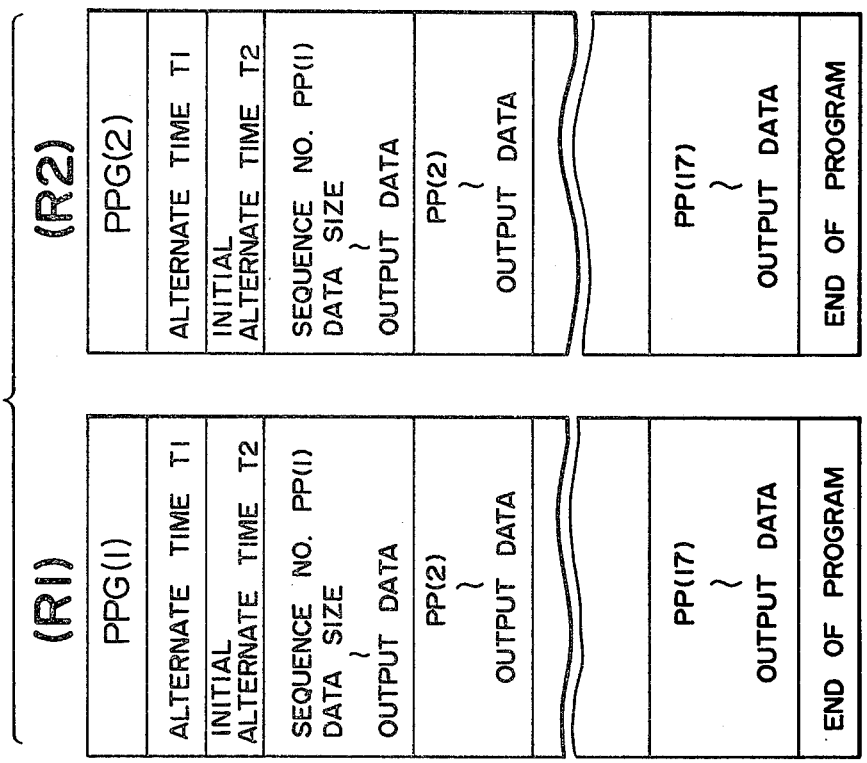
FIGS. 12a to 12b are tables useful to explain the data construction of a process program and a group of process programs.
Figure 12A:
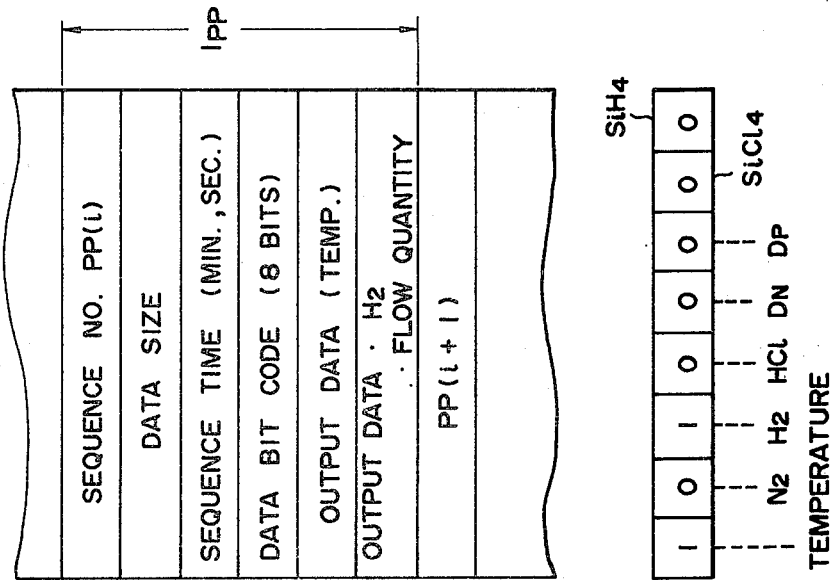

FIGS. 12(a) and 12(b) show the data constructions of a process program PP processed by the system program of this invention, and a process program group PPG comprising a group of the process programs PP, respectively. FIG. 12a shows the content of one process program in which the progress sequence number i is stored in the first memory region, and the total data of the succeeding memory regions is stored in the second memory region.

As the data, are shown the lasting time of the process sequence in the unit of minutes and seconds. In the next memory region is stored an 8 bit data bit code, and the concrete example thereof will be shown later. The furnace temperature among output data is stored in the next memory region.

The next memory region is set with the flow quantity of H$_2$. Where the temperature and H$_2$ are given as the output data, the leftmost bit and a bit spaced therefrom by 2 bits are both "1". Although FIG. 12a shows an example of one PP(i), where there is no temperature designation, and where a plurality of various gases are simultaneously used as the output data, corresponding bits are made to be "1" respectively, whereby the flow quantities of the gases to be sequentially supplied are stored in the memory regions.

FIG. 12b shows the data constructions of process program groups PPG(1) and PPG(2) corresponding to the alternate running shown in FIG. 10. Thus, PPG(1) corresponding to the furnace R1 is stored in the first memory region of the left column.

Alternate running time T1 and initial alternate time T2 are set in the second and third memory regions. In FIG. 10, for PPG(1), this initial alternate time T2 is the sum of the sequence times PP(1) and PP(2). Following the initial alternate time T2, successive process program data of PP(1), PP(2), ... PP(17) are stored in the succeeding memory regions. The last memory region stores a code END OF PROGRAM.

Figure 13:
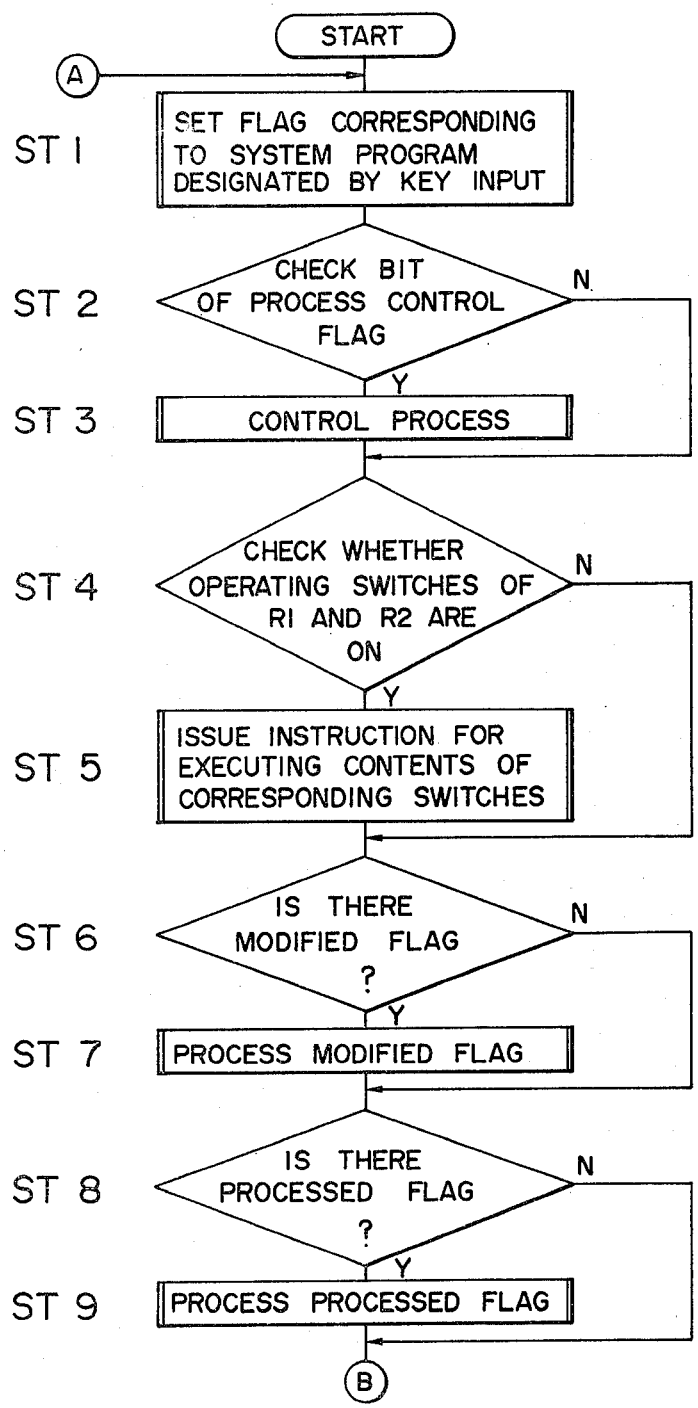
FIG. 13 is a flow chart showing the processing steps of the system program utilized in this invention.
Figure 13:
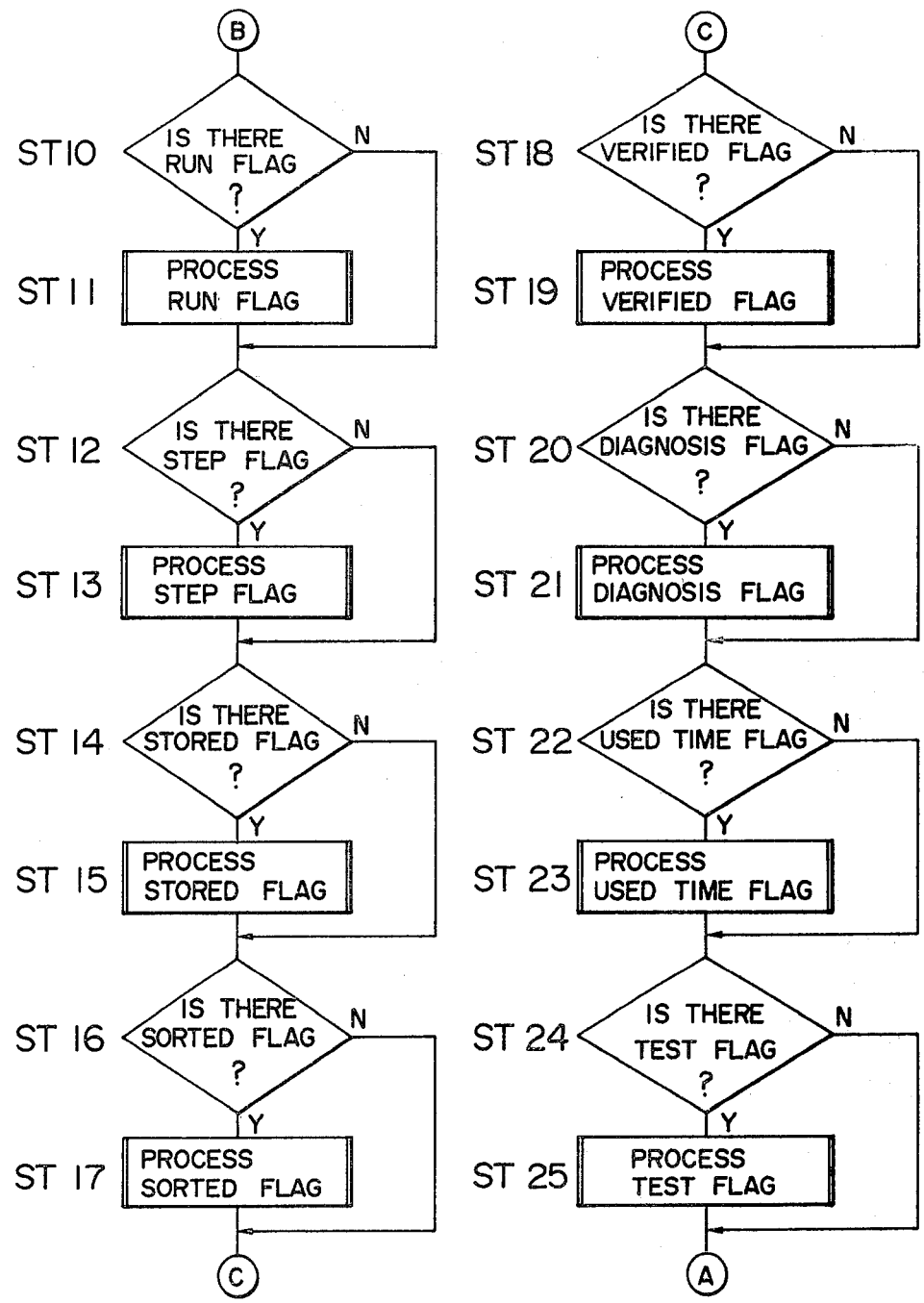

FIG. 13 is a flow chart showing the processing procedure of the system program of this invention. At step 1 following the start of the program steps, a flag corresponding to system programs (some of them are shown in FIG. 4) designated by a key input such as a set value of switch 67-4 shown in FIG. 5, or an input from the key input unit (3, for example $ PROCESS, C, $ RUN, $ FETCH ..., etc.) is set in the flag memory region of RAM27. Then at step 2, the flag bit of a process control flag (meaning inputting of $ PROCESS, C) is checked. When the result of check is YES, at step 3 the process is controlled, whereas when the result is NO, the program is advanced to step 4 where check is made as to whether various operating switches of furnaces R1 and R2 (for example, opening/closing push buttons and motors of the furnaces) are ON or not. When the result of check is YES, at step 5 instructions for executing the states of corresponding switches are issued.

When the result of step 4 is NO, the program is advanced to step 6, and step 6 through step 25 correspond to respective system programs of from MODIFY TO TEST in ROM27 shown in FIG. 4. Usually, only one of the steps 6 through 25 is selected.

Figure 14:
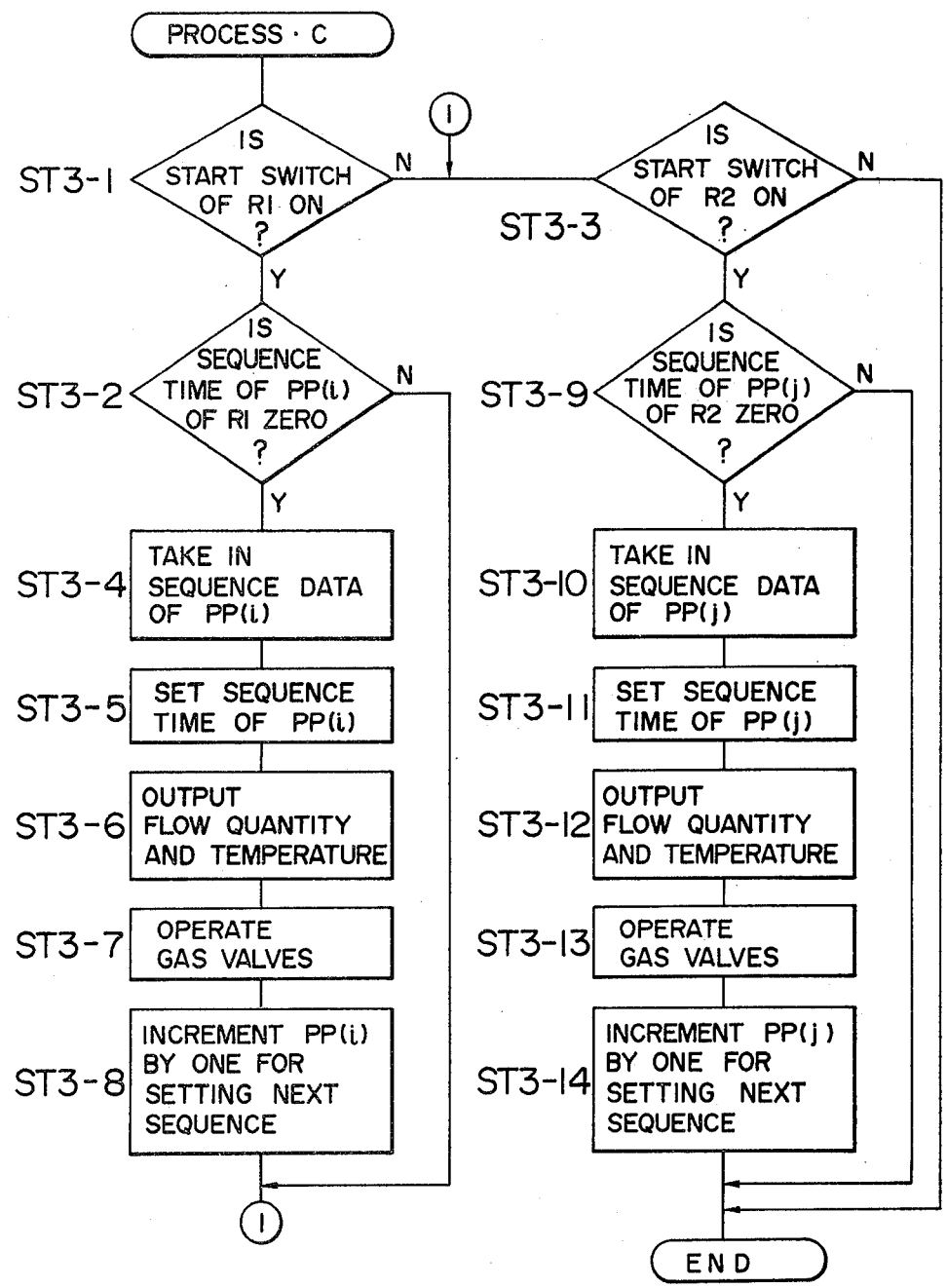
FIG. 14 is a flow chart showing the detail of the subroutine ST3 shown in FIG. 13.

FIG. 14 is a detailed flow chart showing the process control corresponding to a subroutine ST3 shown in FIG. 13. At step ST3-1, when the start switch of the reaction furnace R1 is being closed, the program is advanced to step ST3-2 where check is made as to whether the remaining time of the sequence of the process program PP(i) now being executed among the process program group PPG(1) related to the furnace R1 is zero or not. As shown by the flow chart of a second system program shown in FIG. 22, the sequence remaining time can be determined by setting the sequence time of one PP(i) in a register and then by decrementing the content thereof at each second.

When the sequence remaining time is zero at step ST3-2, at the next ST3-4, the next process program PP(i) is designated to take in its data. Then, at the step ST3-5, the sequence time of the newly designated sequence time is set. As a consequence, the second system program described above is executed. Then at step ST3-6, the output data, that is data regarding designated gas flow quantities, furnace temperature, etc. are outputted, and at step ST3-7, ON, OFF instructions are issued for various valves. Finally at step STP-8, i is incremented by one for preparing next sequence setting.

At step ST3-1, when the start switch of the furnace R1 is OFF, the program is advanced to step ST3-3 where check is made whether the start switch of the furnace R2 is ON or OFF. When the result of step ST3-3 is YES, at step ST3-9 check is made as to whether the sequence remaining time of the process program now being executed among the process program group PPG(2) regarding the furnace R2 is zero or not. Then, contents of the following steps ST3-10 through ST3-14 correspond to those of the steps ST3 through ST3-8.

When the result of step ST3-2 is NO, the program is transferred to step STP-3 through a junction ①. Further, when the results of steps ST-3 and ST3-9 are NO, the program is jumped directly to END, thus completing the processing of the subroutine ST7.

Figure 15:
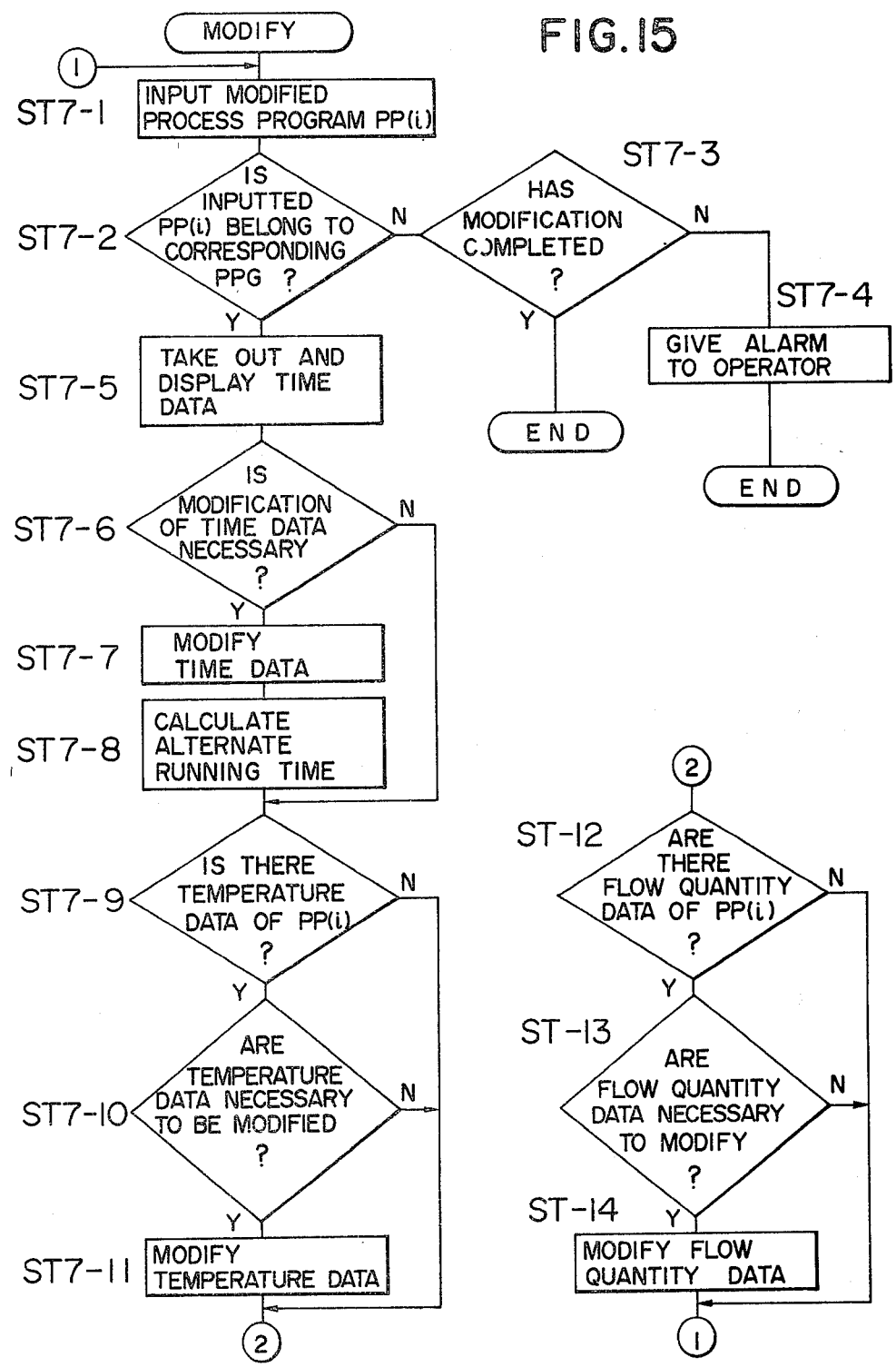
FIG. 15 is a flow chart showing the detail of the subroutine ST7 shown in FIG. 13.

FIG. 15 shows a detailed flow chart of the subroutine ST7 shown in FIG. 13. At the time of modification, when a flag $ MODIFY is inputted by the key, the system displays on the CRT29 a message of the content

"MODIFY BELL—JAR ="

For furnaces R1 and R2, R1→L, and R2→R are inputted where R means right and L left. Then as additional informations, process names (PPG(i) EPi, etc.) prepared after modification, date of edition, name of editor, etc. are registered. Then a check is made as to whether what type of process program groups PPG should be modified to prepare the next program pattern, and the result of the check is inputted. Then a process program group PPG which the operator wants to modify is inputted to the control unit 14.

The system issues the next message, and informations necessary thereto are registered to modify a process program.

A message corresponding to a given PP and a modified state thereof are shown as follows:

| SEQUENCE = PP(3) | |
|---|---|
| $N_2$ = 50 | 45 |
| TIME = 300 | 230. |

This example shows that the flow quantity of $N_2$ is modified from 50 l/min. to 45 l/min., and that the flow time is modified from 3 min. 00 sec. to 2 min. 30 sec.

FIG. 15 shows the detail of the flow chart of modification processing. At step STP-1, a modified process program PP(i) is inputted. Then at step ST7-2, a check is made as to whether the inputted PP(i) belongs to a corresponding PPG or not. When the result of check at step ST7-2 is NO at step STP-3, a check is made whether modification has completed or not, and when the result of check is YES, the subroutine ST7 is terminated. On the other hand, when the result of step ST7-3 is NO, at step ST7-4, an alarm instruction is given to an operator. When the result of step STP-2 is YES, at step ST7-5 time data (sequence time) are taken out and displayed among the output data. At step ST7-6, a check is made whether it is necessary to modify the time data. When the result of step ST7-6 is YES, the time data are modified as above described at step STP-7. Since this requires alternation of alternative running time, at step ST7-8 the alternate running time is calculated and the calculated time is stored in the memory area for the alternate running time of PPG. Then at step ST7-9, a check is made as to whether there are temperature data or not, and at the step ST7-10, a check is made as to whether it is necessary to modify the temperature data. When the result of check at step ST7-10 is YES, the temperature data are modified at step ST7-11. At step ST7-12, a check is made as to whether there are flow data of PP(i) or not, and at step STP-13, a check is made as to whether it is necessary to modify the gas flow quantity or not. When the result of step ST7-13 is YES, at step ST7-14 the data are modified. Thereafter, necessary modifications are made by sequentially designating necessary process programs PP(i) in the given PPG.

To inform the termination of the modification a flag ⓢ is inputted.

The subroutine ST9 shown in FIG. 13 will now be described. The term PROCESS means a processing performance that forms a process program group to be executed. When PROCESS is inputted, the system produces the following message to be displayed on CRT29

"PROCESS BELL—JAR ="

Then, a program for furnace R1 or R2 to be used is inputted with the key. (L or R or (L+R) is inputted). When these inputs are received by the system satisfactorily no problem would be caused, but when erroneous inputs are applied, the system issues an error message, and the message described above is displayed again to request reinputting. In this manner, correct inputting can be assured like a mutual conversation. Then process names, date of forming the same, and the name of an editor are directly registered as additional informations.

Then what type of the process is to be executed is inputted as a process pattern. In the case of a N type vapor phase growth, the following display is inputted.

PROCESS PATTERN=<u>EPiN</u>　　　(1)

in which the underlined portion is inputted. When various informations are inputted in this manner, a program PP to be executed next is prepared. Then, the system issues the following message, and informations necessary therefor are inputted to sequentially form and complete process programs that constitute EPiN.

(2)
SEQUENCE = <u>PP(1)</u>
$N_2$ = <u>50</u>
TIME = <u>300</u> where (2) designates the sequence name, (3) and (4) show informations necessary for the sequence. In the case of (3), $N_2$ is used and the inputted flow quantity is 50 l/min. In (4) the execution time necessary for the sequence is inputted.

Figure 16:
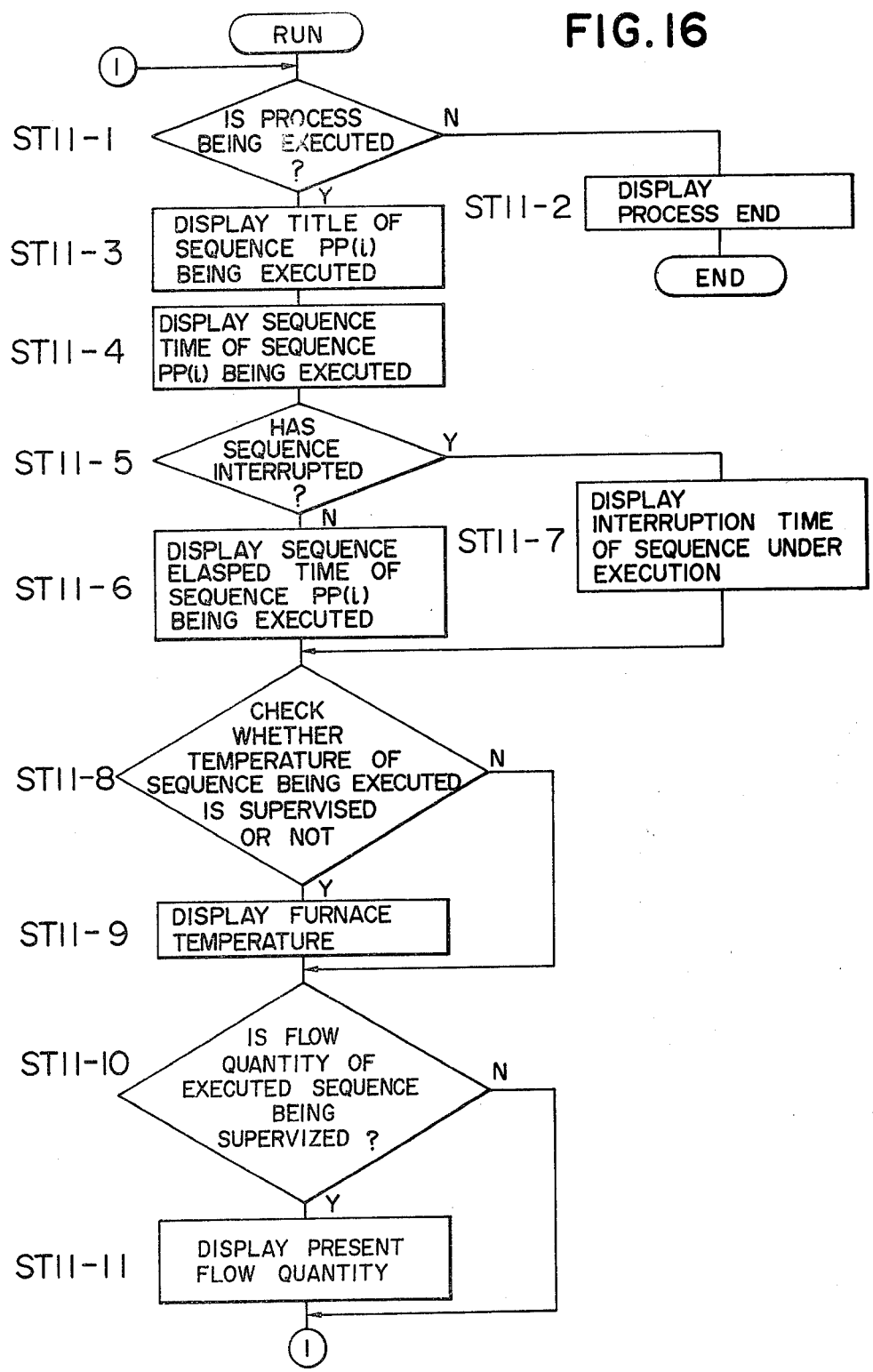
FIG. 16 is a flow chart showing the detail of the subroutine ST10 shown in FIG. 13.

FIG. 16 is a flow chart showing a $RUN. When information $RUN is inputted with the key, the newest information of respective state variations of a process now being executed (corresponding to one process program) is displayed. When a process is being executed in furnace R1 or R2, the following displays are made, for example.

```
**RUN BELL — JAR = R1
    SEQUENCE = EPi 1 DEPO
    SET TIME = 1234
**CURRENT DATA
    TIME = 1200
    H2 = 55
    DN = 10
    SiCl4 = 22
    TIME = 59 (subtraction)
**RUN BELL — JAR = R2
    SEQUENCE = N2 PURGE
    SET TIME = 300
**CURRENT DATA
    N2 = 55
    TIME = 59
```

When one process has been completed, process termination ($$$) is displayed. The displayed contents described above are executed by the processing steps of the procedure shown in the flow chart shown in FIG. 16. Respective steps shown in FIG. 16 will now be described.

First, at ST11-1, a check is made as to whether the process is now being executed or not. If not, at step ST11-2 a process termination ($$$) is displayed. When the result of check at step ST11-1 is YES, at step ST11-3, the name of the process program PP(i) that is a sequence now being executed is displayed. Then, at step ST11-4, the sequence time (SET TIME) of the sequence PP(i) now being executed is displayed, and at the next step ST11-5, a check is made as to whether the sequence is interrupted or not. When the result of the check is YES, at step ST11-7, the interruption time of the sequence PP(i) being executed is interrogated and displayed. The sequence interruption occurs when the operator commands sequence interruption due to some sort of abnormals occurring during the automatic running, and during normal automatic running sequence interruption would never occur. When the result of step ST11-5 is NO, at step ST11-6, the elapsed time of the sequence being executed is displayed.

Then, at ST11-8, a check is made as to whether the sequence being executed is supervising the temperature or not. When the result of check at step ST11-8 is YES, at ST11-9, the presently measured furnace temperature is displayed. When the result of step ST11-8 is NO, at step ST11-10, a check is made as to whether the sequence PP(i) being executed is supervising the gas flow quantity or not. When the result of step ST11-10 is YES, at step ST11-11, the present flow quantity is displayed. On the contrary, when the result of step ST11-10 is NO, the program is returned to the junction ①.

The system program STEP shown in FIG. 4 will now be described. This system program STEP is prepared for charging the order of respective process programs PP(i) in a given process program group PPG(i) and when $STEP is inputted with the key it is displayed as follow

STEP BELL—JAR=R1 in which underlined portion shows the furnace R1 and inputted by the operator with the key. Then, the detail of the process program group, date of edition and the name of editor are registered as necessary directory items. Then the system interrogates that orders of what type of PPG should be changed. This display is as follows PROCESS PATTERN=EPiN in which the underlined portion is the input by the operator and shows a N type vapor phase growth.

As shown in the following, since respective process programs PP(i) in EPiN (one process program group) are sequentially shown by the system, informations necessary therefor are inputted to the right side of the equations with the key.

```
SEQUENCE = PP(1)
SEQUENCE = PP(2)
SEQUENCE = PP(3)
SEQUENCE = PP(4)
      .       .
      .       .
      .       .
SEQUENCE = PP(17)
```

In order to terminate the STEP, $ is inputted.

Figure 17:
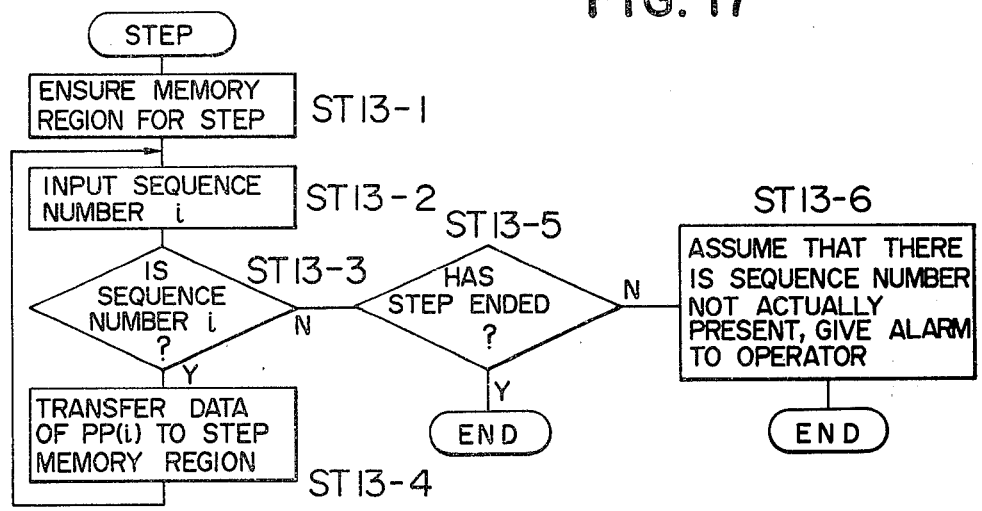
FIG. 17 is a flow chart showing the detail of the subroutine ST13 shown in FIG. 13.

FIG. 17 is a flow chart showing the detail of the subroutine ST13 shown in FIG. 13. More particularly, as $ STEP is inputted, at step ST13-1 a memory region for the STEP is ensured. Then at step ST13-2, a sequence number i is inputted. Thereafter, at step ST13-3, a check is made whether sequence number is i or not. When the result of check at step ST13-3 is YES, the data regarding PP(i) are transferred to the ensured memory region.

If the result of step STP13-5 was NO, at step STP13-5, a check is made whether the STEP has ended or not. When the result is YES, the program is terminated, whereas when the result is NO, at step ST13-6, an alarm is displayed for the operator on the assumption that there is a sequence number actually present, thus terminating the STEP processing.

STORE in ROM27 shown in FIG. 4 will now be described. The purpose of the system program STORE is to transfer a processed or modified process program group PPG to such external memory medium as a cassette magnetic tape, minifloppy disc, and bubble memory device.

Figure 18:
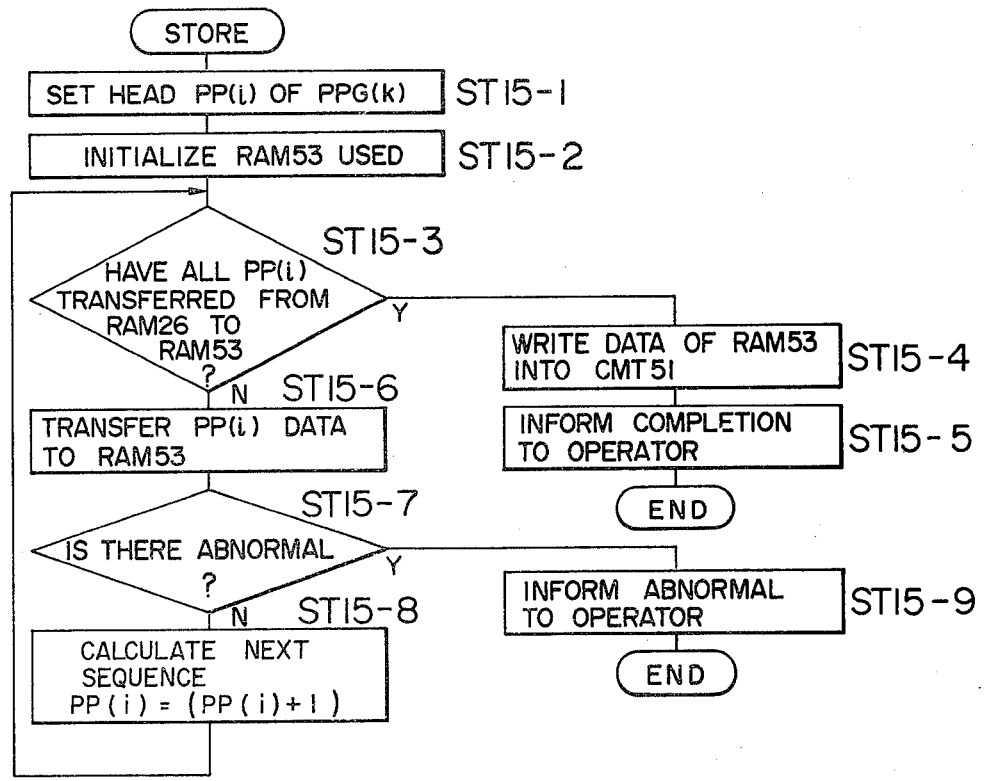
FIG. 18 is a flow chart showing the detail of the subroutine ST15 shown in FIG. 13.

FIG. 18 is a flow chart showing the detail of the subroutine ST15 shown in FIG. 13. At step ST15-1, the head process program (PP(i), i=1) of a program group PPG(K) to be stored in the external memory medium is set, and then at step ST15-2 the external recording medium (CMT51) to be used is initialized to check whether the memory medium can be used or not. After that, at step ST15-3 a judgement is made as to whether all PP(i) have been transferred from RAM26 to RAM53 or not. When the result of judgement is YES, it means that all data regarding one PPG(K) have been transferred from ROM26 to ROM53. Then, at step ST15-4, transfer of data from RAM53 to CMT51 is executed according to the program stored in ROM52. Upon completion of the transfer to CMT51 at step ST15-5, termination is informed to the operator. On the other hand, when the result of step ST15-3 is NO, at step ST15-6, the data of PP(i) are transferred to RAM53.

Then at step ST15-7, a check is made as to whether there is an abnormal or not, and when the result is YES, at step ST15-9, generation of abnormal is informed to the operator. If the result of step ST15-7 is NO, at step ST15-8 i is incremented by one so as to designate the next sequence PP(i+1). Upon completion of the step ST15-8, the program is returned back to step ST15-3 to repeat the steps following thereto. As can be noted from the block diagram shown in FIG. 4, according to the process of STORE, PPG(i) stored in RAM26 is transferred to RAM53 through i/o bus line 23, high speed data transfer unit (HMT)45, data highway 47, HMT50 and data bus line 48. The PPG(K) stored in RAM53 is stored in an external recording medium, e.g. the cassette magnetic tape 51 (CMT) via bus line 48, SUB-CPU 46, bus line 54 and cassette magnetic tape interface 49.

The system program SORT shown in FIG. 4 will now be described. This program SOFT functions oppositely to the program STORE. That is the PPG(K) stored in CMT51 is transferred to RAM26 via RAM53.

Figure 19:
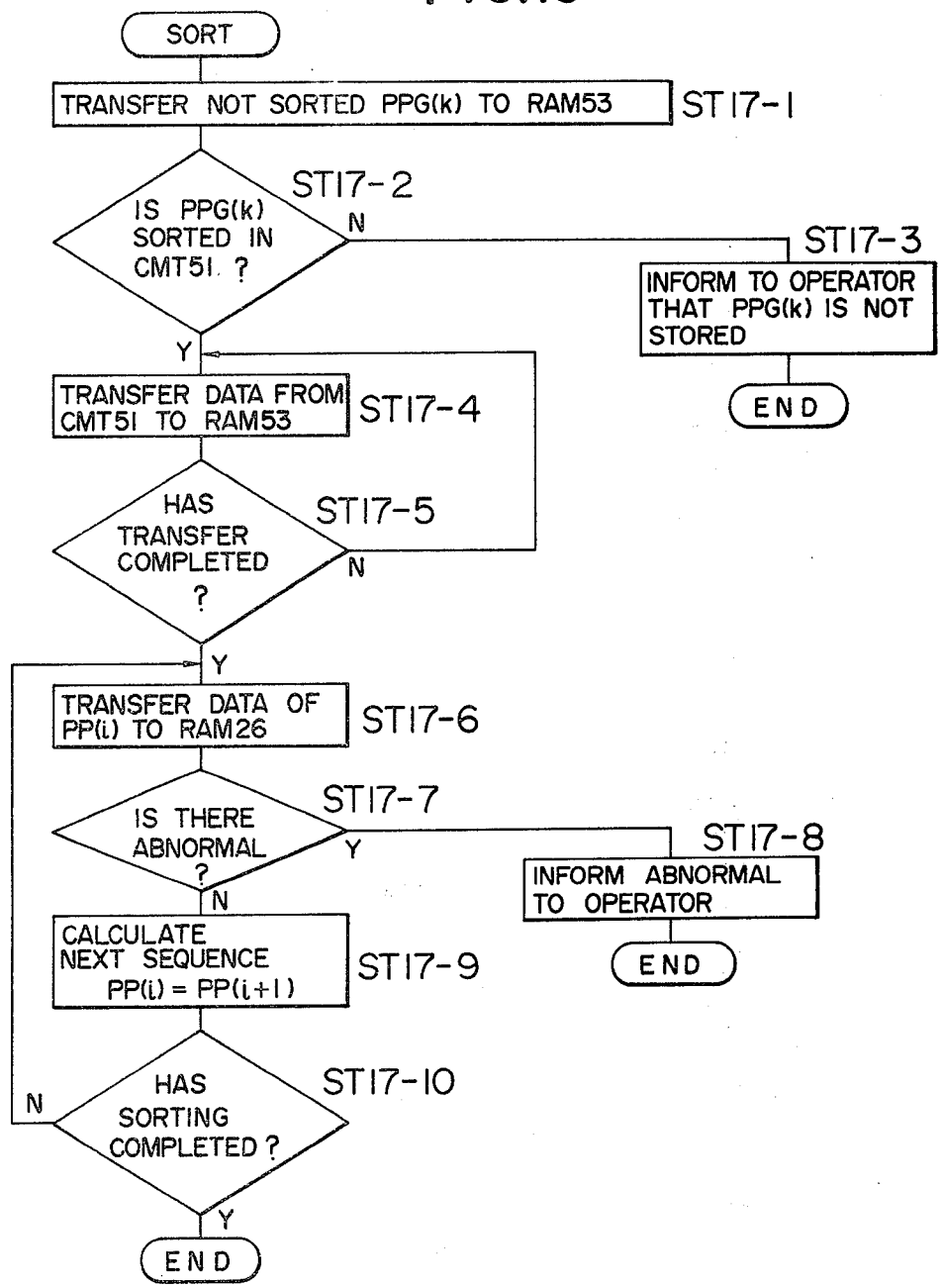
FIG. 19 is a flow chart showing the detail of the subroutine ST17 shown in FIG. 13.

A detailed flow chart of the subroutine ST17, FIG. 13, corresponding to process SORT is shown in FIG. 19. Thus, at step ST17-1, an external memory medium not storing any process program group PPG(K) but to be stored later therewith is designated. Then at step ST17-2, a check is made as to whether PPG(K) is actually stored in the designated external memory medium CMT51 or not. When the result of check is NO, at step ST17-3 this fact is informed to the operator. When the result of step ST17-2 is YES, at step ST17-4 data regarding a PPG(K) are transferred from CMT51 to RAM53. (through ROM52 and CPU46)

After that, at step STP17-5, a check is made whether the transfer of the data from CMT51 to RAM53 has been completed or not. When the result is NO, the program is returned to step ST17-4. On the other hand, when the result is YES, at step STP-6 data of respective PP(i) are transferred to RAM26 acting as the main memory device.

Then at step ST17-7, a check is made whether there is an abnormal or not, and if there is an abnormal it is informed to the operator at step ST17-8.

If there is no abnormal, at step ST17-7, i is incremented by one to prepare a next sequence PP(i+1). Then, at step STP17-10, a check is made whether transfer of data from RAM53 to RAM26 has completed or not. When the result is YES, it means that processing of SORT has been completed and $$$ is displayed. When the result of step ST17-10 is NO, the program is returned to step ST17-6 and the loop is executed again.

The VERIFY system program shown in FIG. 4 will now be described. This system program is utilized to display on the CRT29 a process program group stored in RAM26 for the purpose of being verified by the operator.

When $ VERIFY is inputted, a message

"VERIFY NAME="

is issued so as to output the content of the process program group PPO(K) by inputting the process name to the underlined portion. One example of the display output is as follows:

```
       PROCESS NAME = N
           N2 PURGE
              TIME = 1234
              FLOW OF N2 = 55
           H2 PURGE
              .
              .
              .
```

-continued
```
           N2 PURGE
              FLOW OF N2 = 55
```

In this manner, displayings are sequentially executed and when the content of the last N2 PURGE is outputted the program is terminated.

Figure 20:
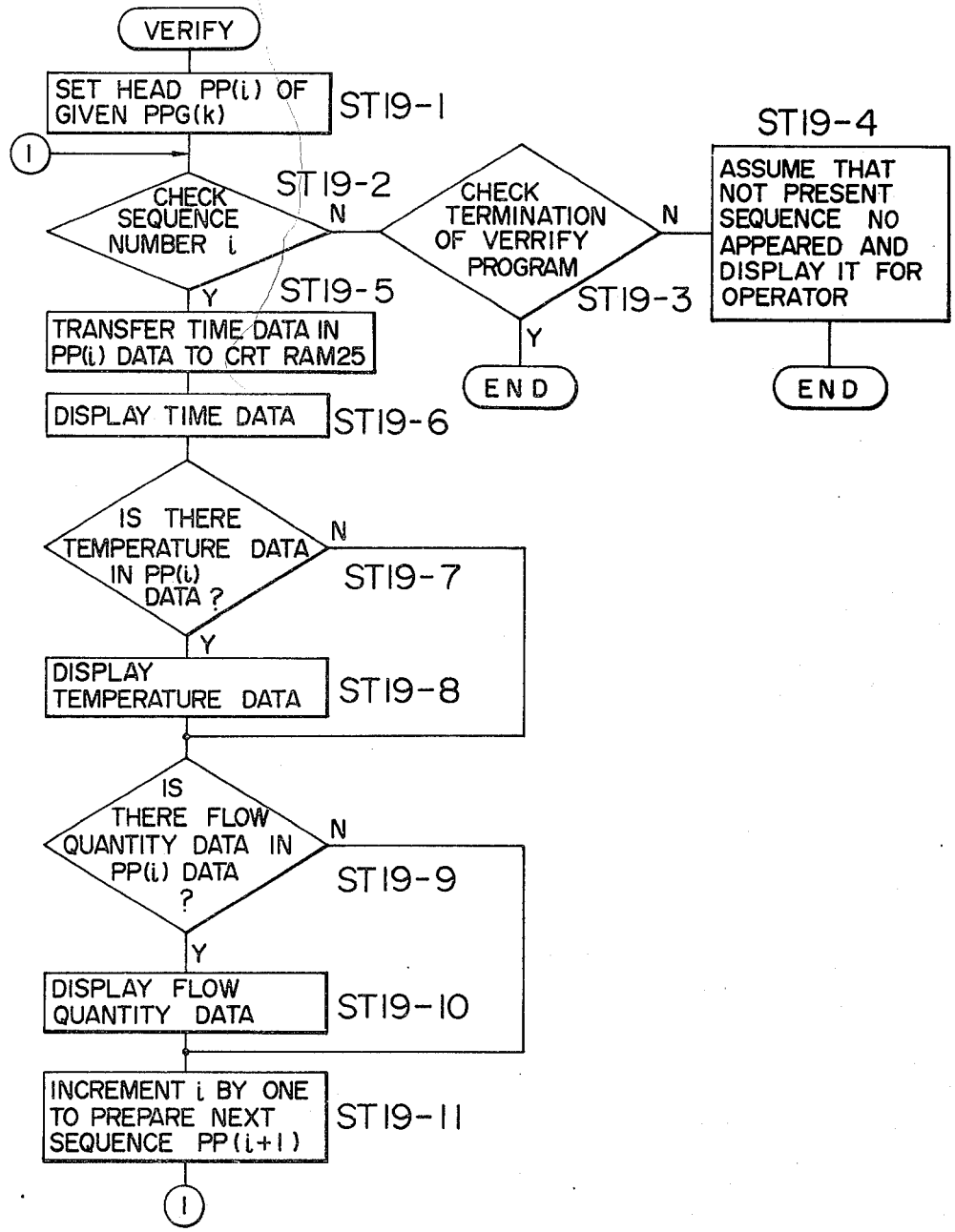
FIG. 20 is a flow chart showing the detail of the subroutine ST 19 shown in FIG. 13.

FIG. 20 shows a detailed flow chart of the subroutine ST19 shown in FIG. 13. Thus, at step ST19-1, a head process program PP(i) of the given PPG(K) is set. Then at step ST19-2, the sequence number of the set PP(i) is checked. If the result of check is NO, at step ST19-3 the termination of the VERIFY PROGRAM is checked. If not terminated, at step ST19-4 it is displayed to the operator on the assumption that not present sequence number has appeared.

When the result of step ST19-2 is YES, the time data (sequence time) in the data of PP(i) is transferred to CRT RAM 25. Then at step ST19-6, the time data is displayed on CRT 29. After that, at ST19-7 a check is made whether there are temperature data in the PP(i) data, and when there are temperature data, at step ST19-8, the temperature data are displayed on CRT29. Then at step ST19-9, a check is made whether there are flow quantity data regarding used gas in the data of PP(i), and if there are the data, the flow quantity data are displayed on CRT29 at step ST19-10.

Then at step ST19-11 i is incremented by one for preparing the next sequence PP(i+1). Thereafter, the program is returned to the junction ① to repeat steps ST19-2 through ST19-11.

The system program DIAGNOSIS shown in FIG. 4 will now be described.

Thus, when a $ DIAGNOSIS is inputted with the key, whether there is an abnormal of the process at the present time or not is checked.

An example of a fault message is as follows.

$ DIAGNOSIS

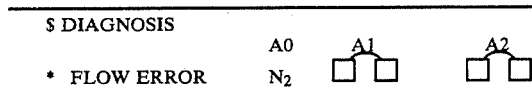

* FLOW ERROR   N2 in which A0 shows a specific flow quantity controller, A1 a set flow quantity and A2 an actual flow quantity during the abnormal.

Figure 21:
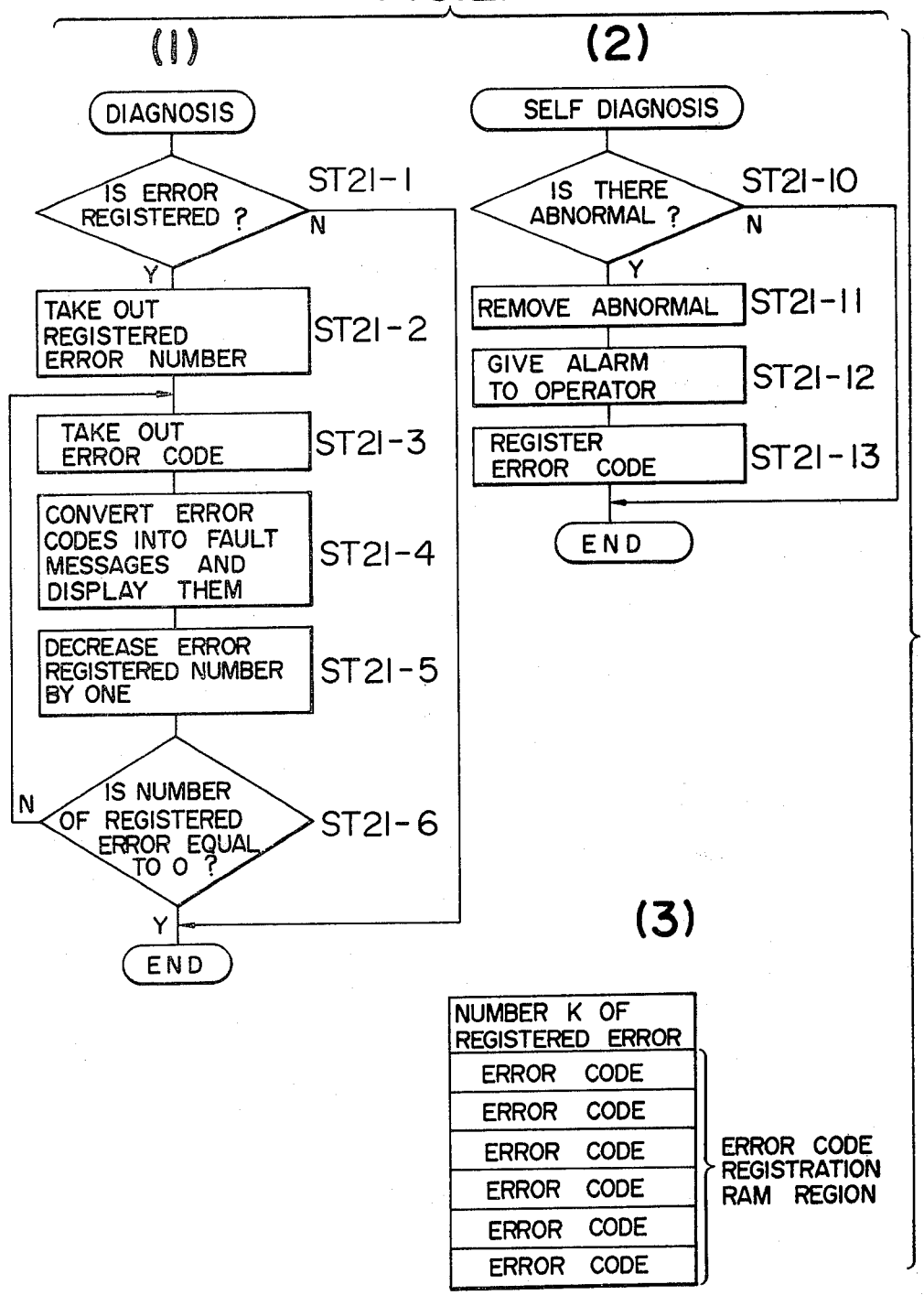
FIG. 21 is a flow chart showing the detail of the subroutine ST21 shown in FIG. 13.

FIG. 21-(1) is a detailed flow chart of the subroutine ST21 shown in FIG. 13. At atep ST21-1 a check is made whether there is an error registration or not. This check is made by checking an error code registration region (FIG. 21-(3)) of RAMs 25 and 55 by executing the self-diagnosis program shown in FIG. 21-(2). When the result of step ST21-1 is YES, at step ST21-2, the number K (FIG. 21(3)) of the registered error is taken out. Then, at step ST21-3, error codes are taken out and at step ST21-4, taken out error codes are connected into fault messages which are displayed on CRT.

Then, at step ST21-5, the number of registered errors is subtracted with 1 and at step ST21-6, a check is made whether there is an error registration number (number of not displayed errors) or not. If the number is not zero the program is returned to step ST21-3. If zero, the system program terminates.

FIG. 21(2) shows the flow chart showing aforementioned self-diagnosis routine, in which at step ST21-10, a check is made as to whether there is an abnormal or not. The checked items includes temperature, flow quantity voltages supplied to various valves, etc. When the result of step ST21-10 is YES, at step ST21-11 instructions necessary to remove abnormal conditions of furnaces R1 and R2 and their peripheral apparatus are given. Such removal can be made, for example, by temporarily stopping the progress of the sequence.

Then at step ST21-21, an alarm is displayed to give an alarm to the operator and at step ST21-13, error codes are registered or stored in corresponding regions of RAM26.

The system program of USED TIME shown in FIG. 4 will be described as follows. USED TIME represents the time spent by reaction furnaces R1 and R2 until present time. When $ USED TIME is inputted by the key

|  | DAYS | HOURS | MIN. | SEC. |
|---|---|---|---|---|
| LEFT USE TIME = | ☐☐ | ☐☐ | ☐☐ | ☐☐ |
| RIGHT USE TIME = | ☐☐ | ☐☐ | ☐☐ | ☐☐ | are displayed on CRT29. In this example, LEFT shows furnace R1, and RIGHT furnace R2.

Figure 22:
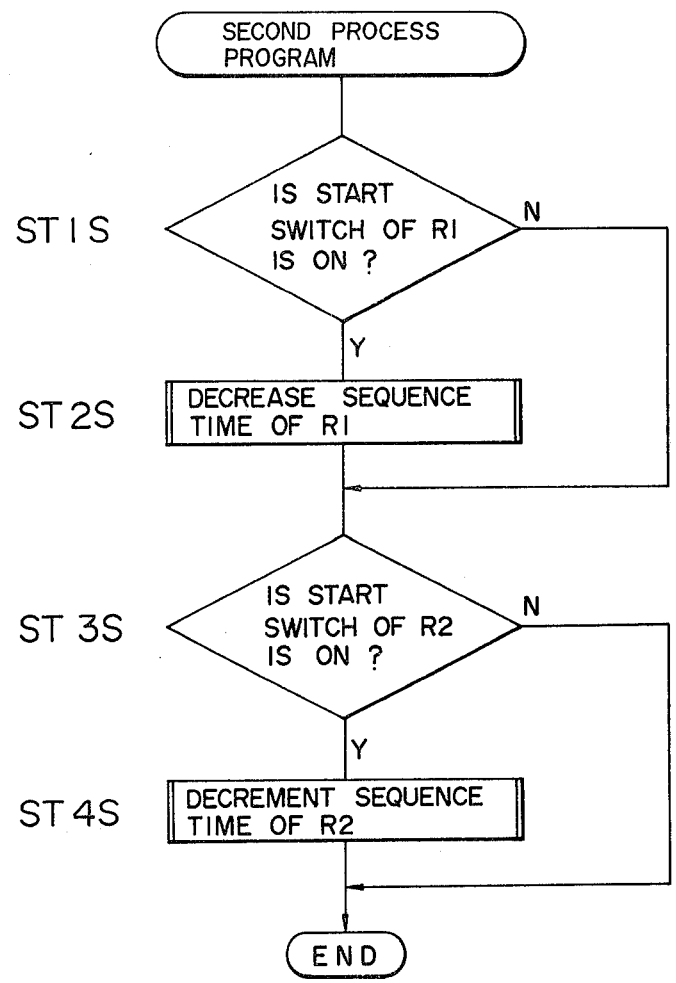
FIG. 22 is a flow chart showing a second processing program related to the subroutine ST23 shown in FIG. 13.

FIG. 22 shows a flow chart of a second processing program in the system program stored in ROM24, and the content of the USED TIME described above are given as a result of execution of the subroutines ST2 and ST4.

In FIG. 22, when the execution of the second processing program is instructed, at step ST1S (S means second), the start switch of the reaction furnace R1 is turned ON. Then at step ST2S, the sequence time of the program is decremented. When the result of step ST1S is NO or when the processing at step ST2S has been completed, at step ST3S a check is made whether the start switch of R2 has been turned ON or not. If ON, the decrement of the sequence time of R2 is done in the same manner as in R2. This second process program is inserted at each second into the main system program of ROM24.

The TEST system program shown in FIG. 4 is as follows. The TEST performance is utilized for the maintenance of the control device of this invention.

TEST PERFORMANCE is divided into 6 items and constructed such that each performance can be called like a conversation for execution.

Respective performances are as follows.

1 EV performance

For the purpose of operating process control valves (Electromagnetic Valves), the operator operates keys of E, V and CR after CRT29 has displayed "NAME=".

Then CRT29 displays "OPEN (Y, *N)=". So the operator operates keys of Y and CR where Y means "YES" and CR means Carriage Return.

In a case of setting the valves to be closed, CRT29 displays as follows and the operator inputs each key shown with a underline.

NAME =(E)(V)(CR)

OPEN (Y, *N) =(N)(CR) or (CR)

NO = (valve member) (CR)

The setting operations terminate when key of "E" is inputted as follows.

NO=(E)(CR)

CRT29 displays

"NAME=".

Aforementioned key operations by the operator are shown as the following underlined portions.

NAME =(E)(V)(CR)

OPEN (Y, *N) =(Y)(CR)

Then, CRT29 displays and requests the operator to input the valve number

NO=(valve number)(CR)

The setting operations for opening the electromagnetic valves are terminated by inputting keys "E" and "CR" after CRT29 has displayed "NO=". Valves whose numbers have been designated remain in the closed or opened states.

Actual examples are as follows:

$(T)(E)(CR)(T),(E)mean test)

NAME =(E)(V)(CR)

NO =(5)(CR)
NO =(1)(0)(CR)   } EV5 and 10 close
NO =(E)(CR)

NAME =(E)(V)(CR)

OPEN (Y, *N) =(Y)(CR)

NO =(7)(CR)
NO =(E)(CR)   } EV7 close

NAME = other performances are called.

(2) MF performance

The purpose of this performance is to operate a mass flow paper riser controller for process control. According to

NAME =(M)(F)(CR)

-continued
```
        INPUT (Y, *N) = (        ) ,
``` an interrogation is made whether an input operation is desired or an output operation (displaying) is desired.

At the time of inputting operation, ⓨ and ⒞⒭ are inputted.

```
    NO = mass flow valve number ⓡ

DATA = *  *   where *  * represemts data value

NO = _____
```

By sequentially designating mass flow valve numbers, data at the time of inputting are displayed for only one minute. At the end of display, CRT29 displays

```
              NO = ⓔ ⒞⒭ .
```

In a case of outputting operation ⓝ ⒞⒭ or ⒞⒭ are inputted.

```
    NO = mass flow valve number ⒞⒭

DATA = flow quantity ⒞⒭

NO = _____
```

By sequentially designating mass flow valve numbers, flow quantities can be set. Termination is designated by ⓔ ⒞⒭ .

EXAMPLE

```
$ TEST

NAME = ⓜⓕ ⒞⒭

INPUT (Y, *N) = ⓝ ⒞⒭ or ⒞⒭

NO = ⑤ ⒞⒭

DATA = ①⑤ ⒞⒭   (15l is designated, MFC5)

NO = ⑧ ⒞⒭

DATA = ③⓪⓪ ⒞⒭   (300 cc is designated, MFC8)

NO = ⓔ ⒞⒭

NAME = ⓜⓕ ⒞⒭

INPUT (Y, *N) = ⓨ ⒞⒭
```

-continued
```
    NO = ⑤ ⒞⒭

DATA = *  *  process for one minute (MFC5)

NO = ⑧ ⒞⒭

DATA = *  *  process for one minute (MFC8)

NO = ⓔ ⒞⒭

NAME = _____
```

③ CRT performance

All characters generated by a character generator is supplied. When outputting of one page (80 characters ×25 lines) is completed, the page is cleared.

```
    NAME = ⓒⓡ ⒞⒭ character service

NAME = _____   other performances are called.
```

④ Lamp performance

Lamps, LED's and buzzers on the operating panel and control panel are sequentially operated. When all outputs are made, the program is cleared and this cycle is repeated five times.

```
    NAME = ⓛⓐ ⒞⒭ outputting

NAME = _____   (other performances are called)
```

⑤ SOL (solenoid valve) performance

Electromagnet valves utilized for transfer switches, R1 clamping device, R1 locking device, R1 sealing device, R1 exhaust device, R2 clamping device, R2 locking device, R2 sealing device and R2 exhaust device are ON/OFF controlled.

```
    NAME = ⓢⓞ ⒞⒭

ON (Y, *N) = _____
```

Thus, an interrogation is made as to whether valves are to be opened or closed.

At the time of opening, ⓨ ⒞⒭ are inputted whereas at the time of closing ⓝ , ⒞⒭ or ⒞⒭ are inputted. Then, according to NO=valve number ⒞⒭ designated valves are ON/OFF controlled.

⑥ ATC (Automatic Temperature Control)

This performance is used for a temperature rise test, a uniform heating test, etc.

```
NAME = (A)(T)(CR)

BELL – JAR =
```

Which one of the bell jars (furnaces R1, R2) is used is interrogated. When characters other than ®  and © are inputted, it is judged that these characters are used for R2. Then, the gas system is transferred to a $N_2$ purge line to seal the bell-jar. When sealed, an exhaust valve is opened. At this time, evacuation is not made because the bell-jar is being evacuated. Thus, the system enables execution of the processes for a selected bell-jar. However, when an abnormal condition is found, the ATC control is cancelled.

Figure 23:
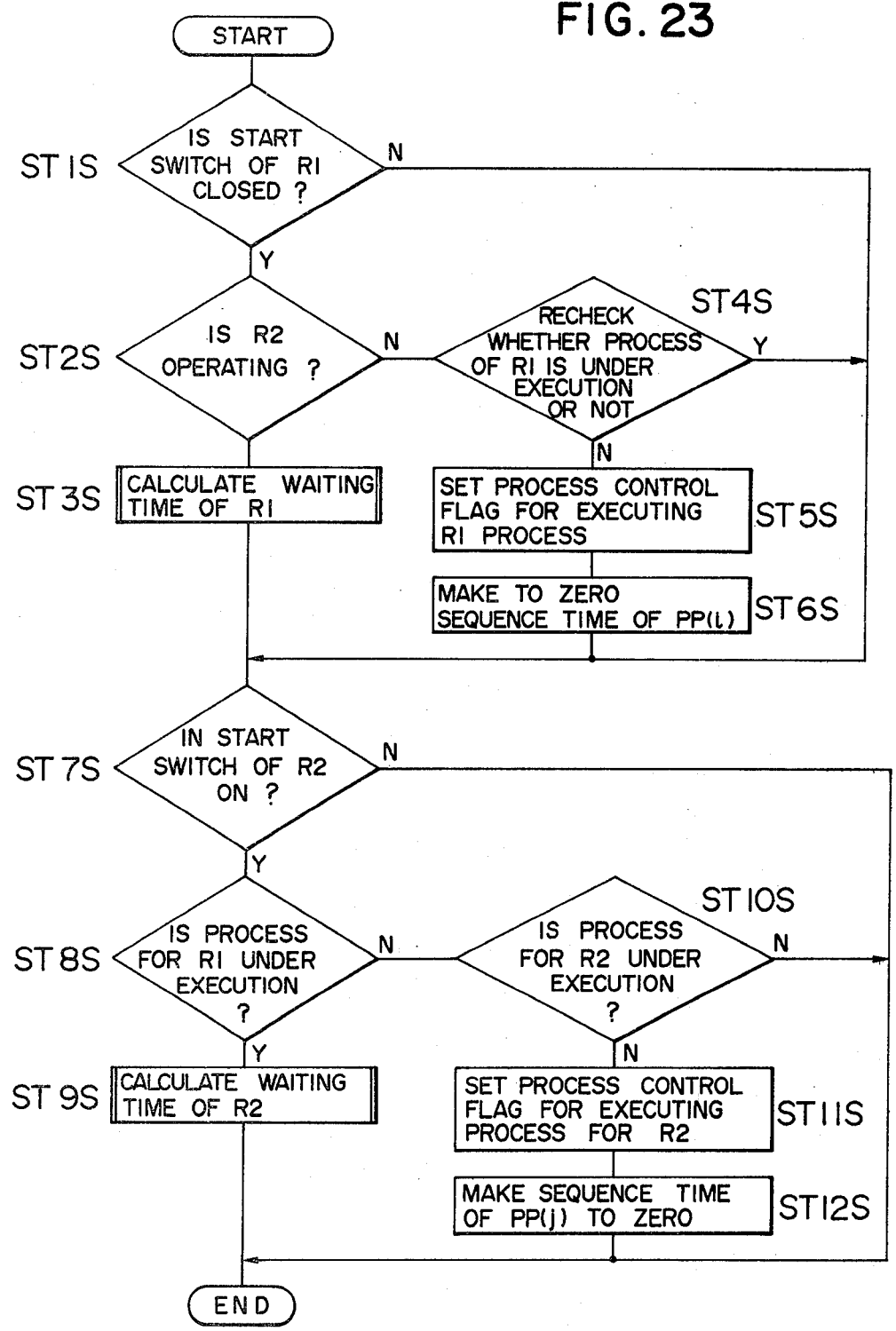
FIG. 23 is a flow chart showing a waiting time calculation.

FIG. 23 is a detailed flow chart for calculating the waiting time at the time of alternate running shown in FIG. 10 and corresponds to one of the system programs stored in ROM24 shown in FIG. 4. More particularly, at step ST1s, a check is made as to whether the start switch of the reaction furnace R1 is ON or not. When the result is NO, the program is jumped to step ST7S, whereas when the result is YES, at step ST2S, a check is made as to whether the process of the other furnace R2 is under execution or not. When the result is YES, at step ST3S, the waiting time of furnace R1 is calculated.

When the result of step ST2S is NO, in other words, the start switch of R2 has not yet been closed, at step ST4S, a check is made again as to whether the process of R1 is under execution or not, and when the result is YES, the program is jumped to step ST7S. When the result of step ST4S is NO, at step ST5S, a process control flag is set for executing the process of R1. Then at step ST6S, the sequence time of PP(i), that is the first process program PP(i) of the process group PPG to be executed for R1 is made to zero. After that, contents of steps ST1S through ST12S corrrespond as follows: ST1S→ST7S, ST2S→ST8S, ST3S→ST9S, ST4S→ST10S, ST5S→ST11S, ST6S→ST12S for respective furnaces R1 and R2.

In the foregoing description, reaction furnaces R1 and R2 were in the form of induction heating coils, and the furnaces were alternately operated for efficiently utilizing the source of heating power. However, heating can also be made with lamps as shown in FIG. 24.

Figure 24:
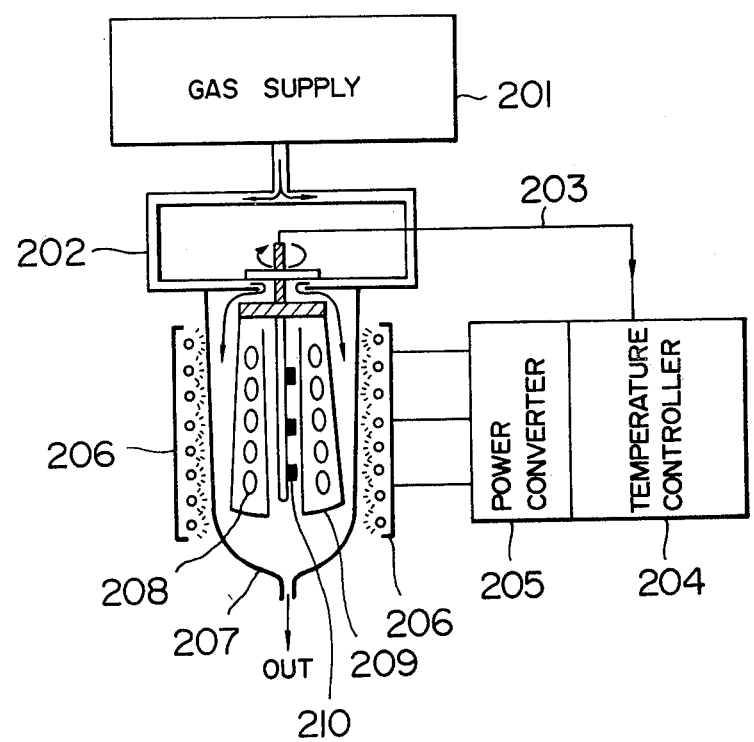
FIG. 24 is a diagrammatic representation of a reaction furnace of the lamp heating type.

In FIG. 24, 201 designates a source of various gases supplied to a reaction furnace 207 and the gases are admitted into the furnace 207 through a conduit as shown by arrows. A frusto-conical shaped support 209 is supported from above to be rotatable. Substrates or wafers on which semiconductors are to be grown in vapor phase are mounted on the peripheral surface of the support. Temperature sensors 210 are secured to the rotary shaft of the support 209 and signals from the temperature sensors 210 are applied to a temperature controller 204 over a conductor 203. The temperature controller 204 supplies a control signal to a power converter 205 which supplies electric power to incandescent lamps 206 disposed on the outer periphery of the furnace 207. Accordingly, light emitted by the lamps 206 reaches the wafers 208 through an outer wall or casing made of quartz or the like. With this lamp heating type, since the wafers 208 are heated by the lamps 206 through the outer wall so that power consumption is smaller than the induction coil heating. When a plurality of lamp heated furnaces are connected in parallel with the source of gases, each furnace can operate independently of the processing executed in the other furnaces.

As above described, the vapor phase growing apparatus of this invention can obviate various problems of the prior art pin board type. Especially for the automatic operation, the gas flow quantity data and the temperature instruction data among output instruction data can be beforehand included in the process program so that the operator is not required to issue any construction instruction for the vapor phase growth reaction.

We claim:

1. Semiconductor vapor phase growing apparatus comprising:
   a reaction furnace for vapor phase growing a semiconductor on a semiconductor substrate;
   means for heating said substrate;
   sources of various gases necessary for vapor phase growth;
   a pipe line network for interconnecting said reaction furnace and said sources;
   valve means connected in said pipe line network for supplying predetermined quantities of said gases to said reaction furnace; and
   control means for supplying control signals to said valve means,
   said control means including a first memory region for storing a process program group comprising a group of process programs including informations regarding a time for designating a process of vapor phase growth in said reaction furnace, gases utilized, flow quantities thereof and furnace temperature, and a second memory region that stores a system program that decodes said process program group for producing control signals for said valve means.

2. The apparatus according to claim 1 wherein said control means comprises means for displaying contents of said process programs, and key input means whereby the contents of said process program group stored in said first memory region are displayed on said display means with said key input means, and wherein said system program includes a modifying program responsive to an input signal from said key input means, for modifying said process program group.

3. The apparatus according to claim 1 wherein said control means is provided with input means for process program group adapted to be supplied with process program groups stored in external memory medium.

4. The apparatus according to claim 3 wherein said external memory medium comprises a magnetic tape or a magnetic card.

5. The apparatus according to claim 1 which further comprises another reaction furnace, both of said reaction furnaces are provided with induction heating coils for heating said substrates, and wherein said control means includes a transfer switch for alternately connecting said induction heating coils to a common high frequency source.

6. The apparatus according to claim 1 wherein said memory region stores said process program group including data regarding an interval of operation of said reaction furnace.

7. The apparatus according to claim 4 wherein said control means comprises arithmetic operating means which calculates a first interval between starting of a first process program group executed for operating one reaction furnace and termination of said process, and a second interval between starting of a second process program group executed for operating another reaction furnace and termination thereof.

8. The apparatus according to claim 4 further comprising a plurality of starting switches adapted to start first and second reaction furnaces and arithmetic operation means which calculates a first process sequence starting time of said second furnace based on an interval T1 between closure of a starting switch of the first reaction furnace and termination of process program group corresponding thereto, an interval T2 between starting of a second process program corresponding to said second furnace and a heating instruction, and a time T3 at which a starting switch of said second reaction furnace is operated thereby shortening an interval between termination of power supply to the first furnace and start of power supply to said second furnace.

9. The apparatus according to claim 8 wherein said arithmetic operation means comprises a counter set with an execution time of said first process program group regarding said first reaction furnace, means for decrementing content of said counter at each definite time, means for subtracting an execution time of the second process program group regarding said second reaction furnace from the count of said counter to produce a remaining time, and means for issuing an instruction for starting said second process program group when said counter completes counting of said remaining time.

10. The apparatus according to claim 8 which further comprises another counter set with a difference between an interval between starting of the first process program group regarding said first reaction furnace and termination of heating thereof, and an interval between starting of the second process program group regarding the second reaction furnace and issuance of a heating instruction thereto, means for decrementing count of said another counter at each definite time after starting of said first process program group, and means to start execution of said second process program group when the content of said another counter is reduced to zero.

11. The apparatus according to claim 1 wherein said reaction furnace comprises a vertical rotary support for supporting a plurality of semiconductor substrates about a peripheral surface of said support, a transparent sealed casing surrounding said support, incandescent lamps disposed on the outside of said casing for heating said semiconductor substrates and means for introducing reaction gases into said casing for causing vapor phase growth of N or P type semiconductor layers on said semiconductor substrates.

* * * * *